US009095074B2

(12) United States Patent
Haba et al.

(10) Patent No.: US 9,095,074 B2
(45) Date of Patent: *Jul. 28, 2015

(54) STRUCTURE FOR MICROELECTRONIC PACKAGING WITH BOND ELEMENTS TO ENCAPSULATION SURFACE

(71) Applicant: Invensas Corporation, San Jose, CA (US)

(72) Inventors: Belgacem Haba, Saratoga, CA (US); Ilyas Mohammed, Santa Clara, CA (US); Terrence Caskey, Santa Cruz, CA (US); Reynaldo Co, Santa Cruz, CA (US); Ellis Chau, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/517,268

(22) Filed: Oct. 17, 2014

(65) Prior Publication Data
US 2015/0034371 A1    Feb. 5, 2015

Related U.S. Application Data

(63) Continuation of application No. 13/722,189, filed on Dec. 20, 2012, now Pat. No. 8,878,353.

(51) Int. Cl.
*H01L 23/48* (2006.01)
*H01L 21/00* (2006.01)
(Continued)

(52) U.S. Cl.
CPC ............ *H05K 1/185* (2013.01); *H01L 23/3128* (2013.01); *H01L 23/3135* (2013.01);
(Continued)

(58) Field of Classification Search
USPC .......... 257/686, 693, 697, 700–702, E23.024, 257/E25.006, E25.021, E25.027, E23.085; 438/106, 109, 111, 112
See application file for complete search history.

(56) References Cited

U.S. PATENT DOCUMENTS 3,289,452 A    12/1966  Koellner
3,358,897 A    12/1967  Christensen
(Continued)

FOREIGN PATENT DOCUMENTS

CN    1641832 A    7/2005
CN    101449375 A    6/2009
(Continued)

OTHER PUBLICATIONS

International Search Report and Written Opinion for Application No. PCT/US2011/024143 dated Jan. 17, 2012.
(Continued)

*Primary Examiner* — Jasmine Clark
(74) *Attorney, Agent, or Firm* — Lerner, David, littenberg, Krumholz & Mentlik, LLP

(57) ABSTRACT

A structure may include bond elements having bases joined to conductive elements at a first portion of a first surface and end surfaces remote from the substrate. A dielectric encapsulation element may overlie and extend from the first portion and fill spaces between the bond elements to separate the bond elements from one another. The encapsulation element has a third surface facing away from the first surface. Unencapsulated portions of the bond elements are defined by at least portions of the end surfaces uncovered by the encapsulation element at the third surface. The encapsulation element at least partially defines a second portion of the first surface that is other than the first portion and has an area sized to accommodate an entire area of a microelectronic element. Some conductive elements are at the second portion and configured for connection with such microelectronic element.

20 Claims, 19 Drawing Sheets

(51) Int. Cl.
  *H05K 1/18*   (2006.01)
  *H01L 23/528*   (2006.01)
  *H01L 23/31*   (2006.01)
  *H01L 23/498*   (2006.01)
  *H01L 25/065*   (2006.01)
  *H01L 25/10*   (2006.01)
  *H01L 25/03*   (2006.01)
  *H01L 21/56*   (2006.01)
  *H01L 23/00*   (2006.01)

(52) U.S. Cl.
  CPC ...... *H01L23/3157* (2013.01); *H01L 23/49811* (2013.01); *H01L 23/528* (2013.01); *H01L 24/13* (2013.01); *H01L 24/14* (2013.01); *H01L 24/17* (2013.01); *H01L 25/0657* (2013.01); *H01L 25/105* (2013.01); *H05K 1/181* (2013.01); *H01L 21/56* (2013.01); *H01L 24/16* (2013.01); *H01L 25/03* (2013.01); *H01L 2224/10126* (2013.01); *H01L 2224/1191* (2013.01); *H01L 2224/11334* (2013.01); *H01L 2224/131* (2013.01); *H01L 2224/13017* (2013.01); *H01L 2224/13022* (2013.01); *H01L 2224/13076* (2013.01); *H01L 2224/13082* (2013.01); *H01L 2224/1403* (2013.01); *H01L 2224/14051* (2013.01); *H01L 2224/14135* (2013.01); *H01L 2224/16105* (2013.01); *H01L 2224/16145* (2013.01); *H01L 2224/16227* (2013.01); *H01L 2224/1703* (2013.01); *H01L 2224/17051* (2013.01); *H01L 2224/32225* (2013.01); *H01L 2224/48091* (2013.01); *H01L 2224/48227* (2013.01); *H01L 2224/73265* (2013.01); *H01L 2225/06513* (2013.01); *H01L 2225/06517* (2013.01); *H01L 2225/1023* (2013.01); *H01L 2225/1058* (2013.01); *H01L 2924/15311* (2013.01); *H01L 2924/15321* (2013.01); *H01L 2924/15322* (2013.01); *H01L 2924/19107* (2013.01); *H05K 2201/10515* (2013.01); *H05K 2201/10977* (2013.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |

(56) References Cited

U.S. PATENT DOCUMENTS

| | | |
|---|---|---|
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,058,101 B2 | 11/2011 | Haba et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,304,900 B2 | 11/2012 | Jang et al. |
| 8,314,492 B2 | 11/2012 | Egawa |
| 8,319,338 B1 | 11/2012 | Berry et al. |
| 8,482,111 B2 | 7/2013 | Haba |
| 8,525,314 B2 | 9/2013 | Haba et al. |

(56) References Cited

U.S. PATENT DOCUMENTS

| | | |
|---|---|---|
| 8,525,318 B1 | 9/2013 | Kim et al. |
| 8,659,164 B2 | 2/2014 | Haba |
| 8,680,684 B2 | 3/2014 | Haba et al. |
| 8,728,865 B2 | 5/2014 | Haba et al. |
| 8,878,353 B2 * | 11/2014 | Haba et al. .................. 257/686 |
| 8,927,337 B2 | 1/2015 | Haba et al. |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2007/0015353 A1 | 1/2007 | Craig et al. |
| 2007/0090524 A1 | 4/2007 | Abbott |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |

(56) References Cited

U.S. PATENT DOCUMENTS

| | | |
|---|---|---|
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0193937 A1 | 8/2010 | Nagamatsu et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2012/0007232 A1 | 1/2012 | Haba |
| 2012/0015481 A1 | 1/2012 | Kim |
| 2012/0018885 A1 | 1/2012 | Lee et al. |
| 2012/0025365 A1 | 2/2012 | Haba |
| 2012/0043655 A1 | 2/2012 | Khor et al. |
| 2012/0061814 A1 | 3/2012 | Camacho et al. |
| 2012/0063090 A1 | 3/2012 | Hsiao et al. |
| 2012/0086130 A1 | 4/2012 | Sasaki et al. |
| 2012/0104595 A1 | 5/2012 | Haba et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280386 A1 | 11/2012 | Sato et al. |
| 2013/0049221 A1 | 2/2013 | Han et al. |
| 2013/0069222 A1 | 3/2013 | Camacho |
| 2013/0105979 A1 | 5/2013 | Yu et al. |
| 2013/0134588 A1 | 5/2013 | Yu et al. |
| 2014/0036454 A1 | 2/2014 | Caskey et al. |

FOREIGN PATENT DOCUMENTS

| | | |
|---|---|---|
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | 59189069 | 10/1984 |
| JP | 61125062 A | 6/1986 |
| JP | 62-226307 | 10/1987 |
| JP | 1012769 A | 1/1989 |
| JP | 64-71162 | 3/1989 |
| JP | 06268015 A | 9/1994 |
| JP | 07-122787 A | 5/1995 |
| JP | 09505439 | 5/1997 |
| JP | 1118364 | 1/1999 |
| JP | 11-074295 A | 3/1999 |
| JP | 11135663 A | 5/1999 |
| JP | 11251350 A | 9/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006186086 A | 7/2006 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20150012285 A | 2/2015 |
| TW | 200810079 A | 2/2008 |
| TW | 200933760 A | 8/2009 |
| TW | 201023277 A | 6/2010 |
| WO | 02/13256 A1 | 2/2002 |
| WO | 03045123 A1 | 5/2003 |
| WO | 2006050691 A2 | 5/2006 |
| WO | 2008065896 A1 | 6/2008 |
| WO | 2008120755 A1 | 10/2008 |
| WO | 2010101163 A1 | 9/2010 |

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

North Corporation, "Processed Intra-layer Interconnection Material for PWBs [Etched Copper Bump with Copper Foil]," NMBITM, Version 2001.6.

Kim et al., "Application of Through Mold Via (TMV) as PoP base package", 6 pages (2008).

International Search Report, PCT/US2005/039716, Apr. 5, 2006.

International Search Report Application No. PCT/US2011/024143, dated Sep. 14, 2011.

Korean Search Report KR10-2011-0041843 dated Feb. 24, 2011.

International Search Report and Written Opinion PCT/US2011/044342 dated May 7, 2012.

Bang, U.S. Appl. No. 10/656,534, filed Sep. 5, 2003.

International Search Report and Written Opinion for Application No. PCT/US2011/044346 dated May 11, 2012.

Partial International Search Report from Invitation to Pay Additional Fees for Application No. PCT/US2012/028738 dated Jun. 6, 2012.

Korean Office Action for Application No. 10-2011-0041843 dated Jun. 20, 2011.

"EE Times Asia" [online]. [Retrieved Aug. 5, 2010]. Retrieved from internet. <http://www.eetasia.com/ART_8800428222_480300_nt_dec52276.HTM>, 4 pages.

(56) References Cited

OTHER PUBLICATIONS

Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC Ltd.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 mailed May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
Korean Office Action for Application No. 2014-7025992 dated Feb. 5, 2015.
Taiwanese Office Action for Application No. 100140428 dated Jan. 26, 2015.

\* cited by examiner

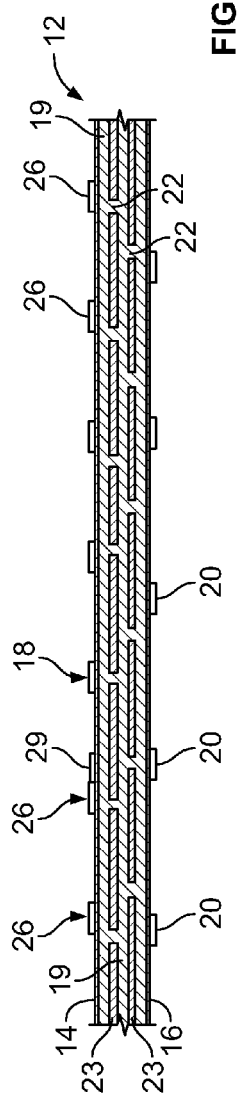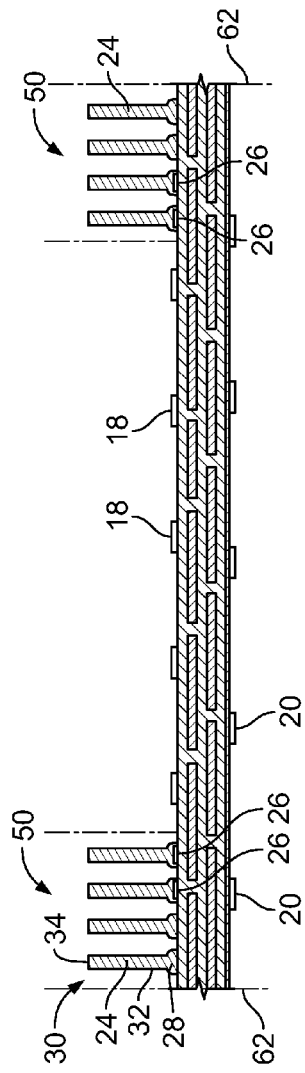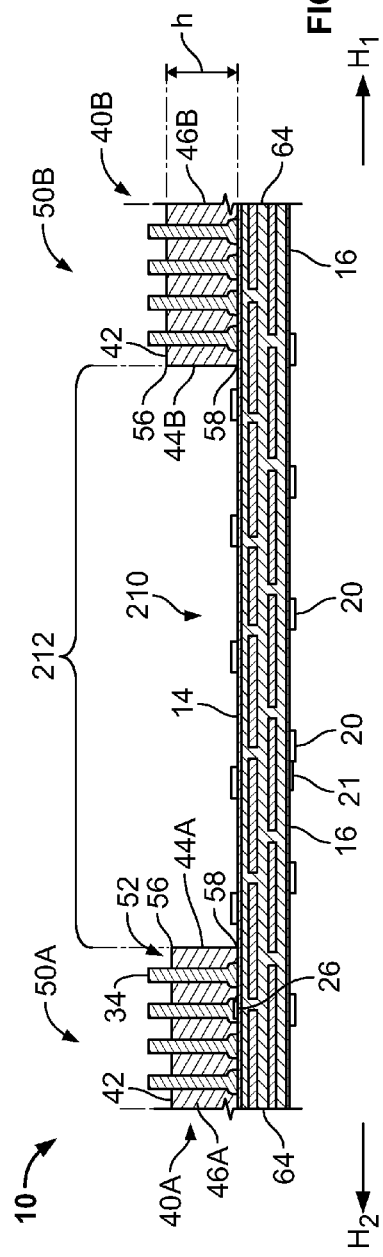

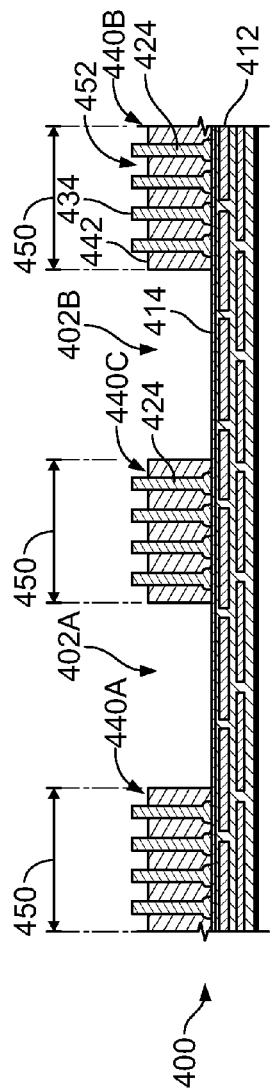
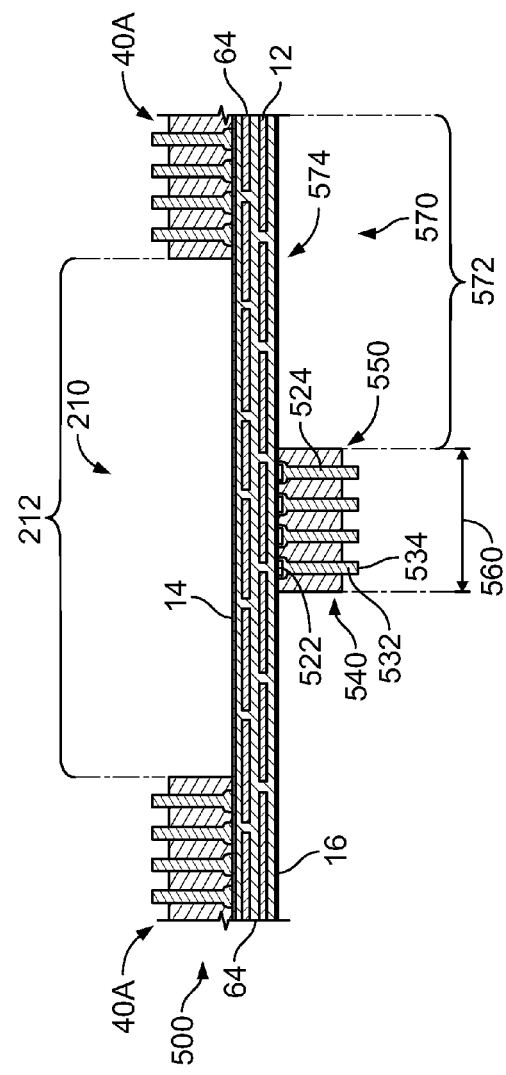

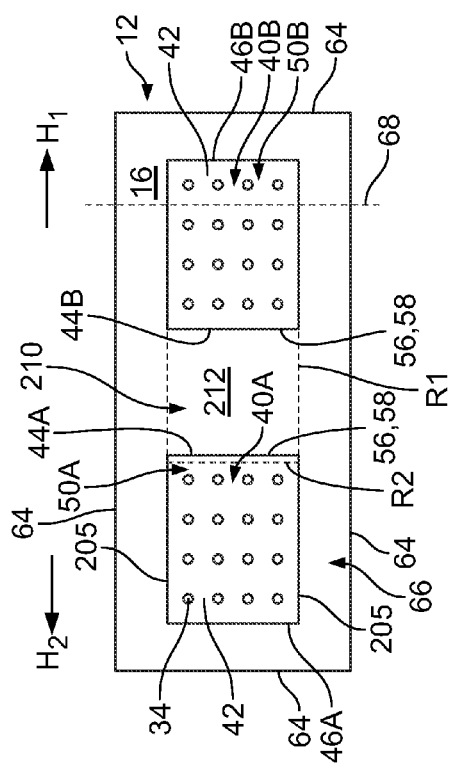
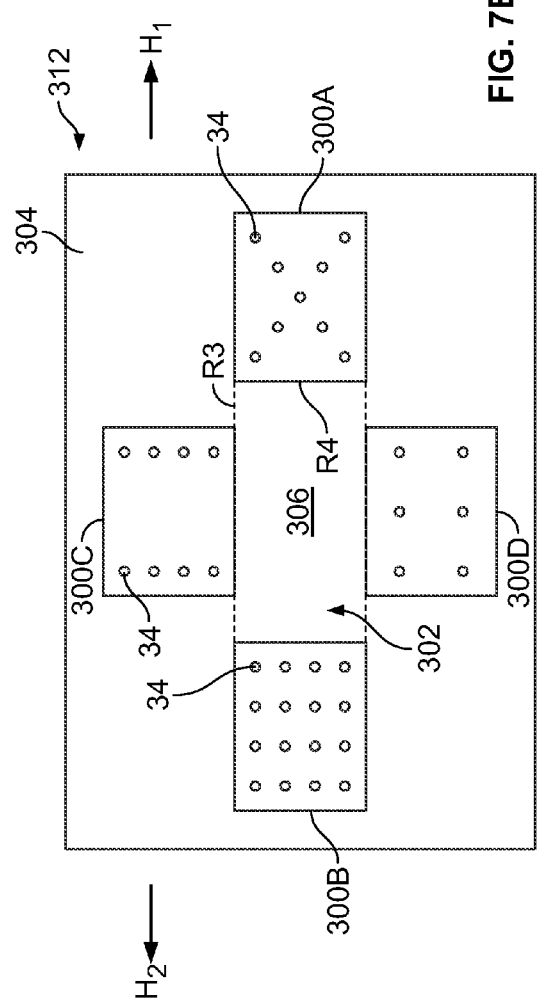

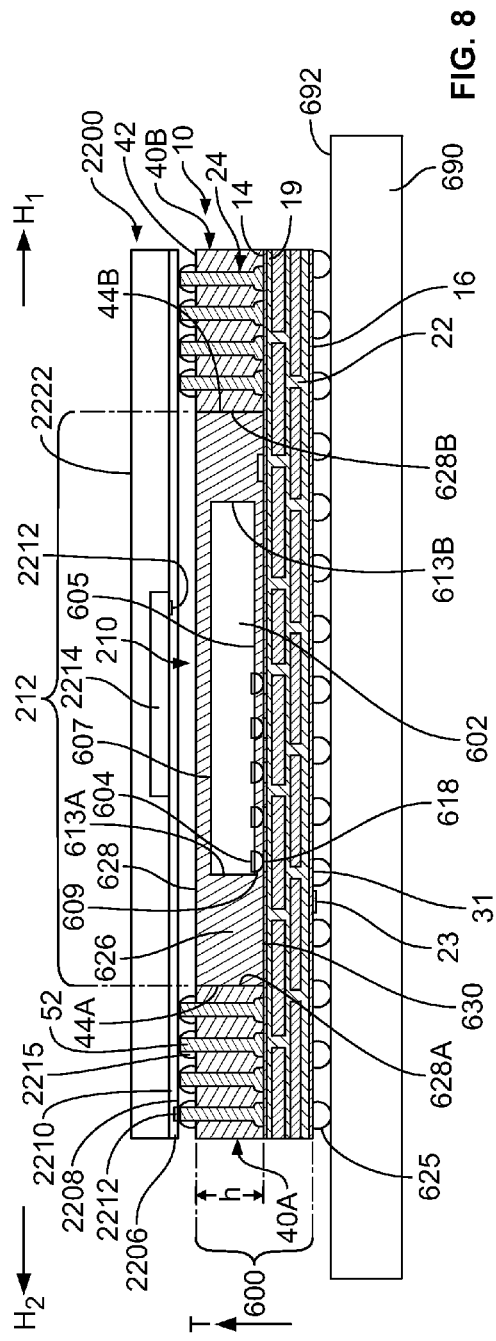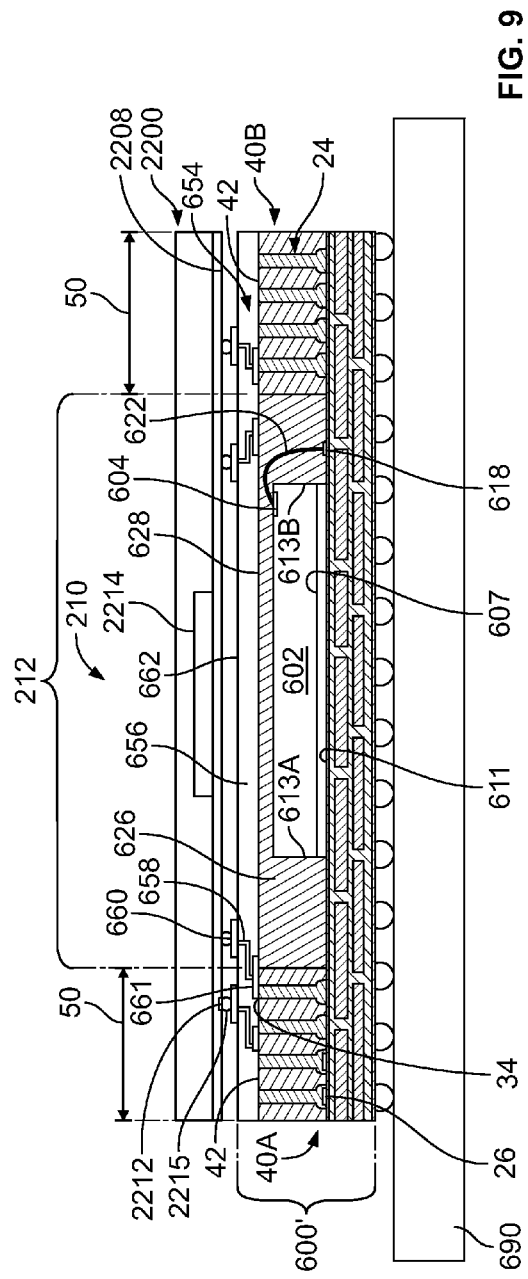

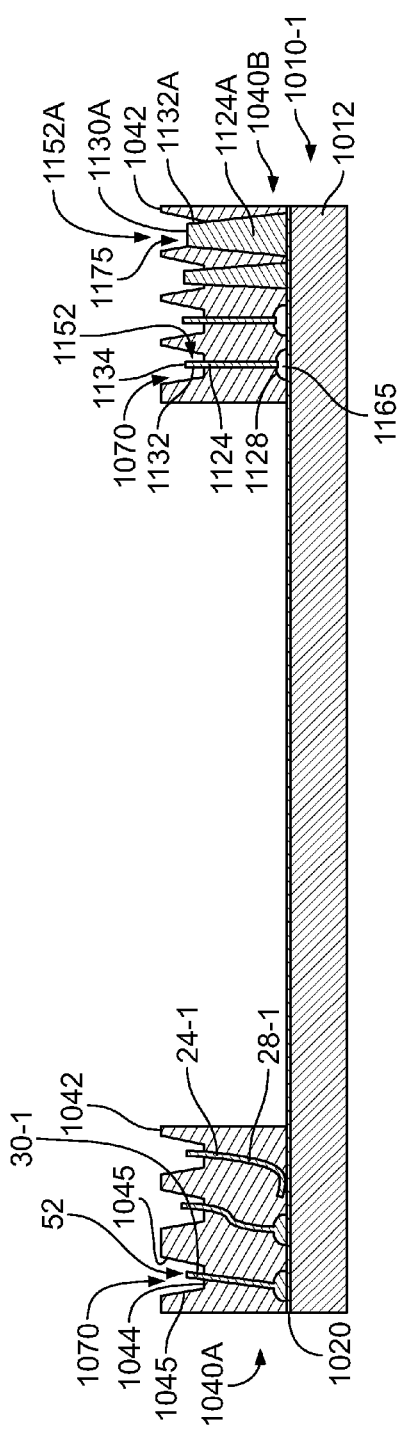
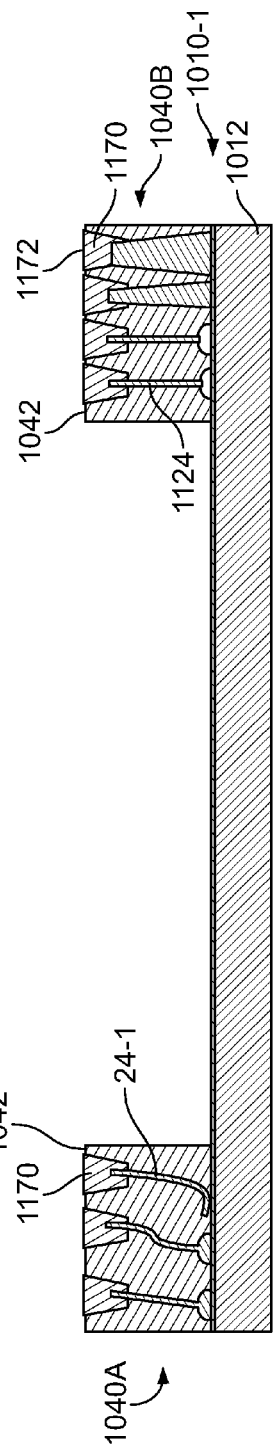
FIG. 16A
FIG. 16B

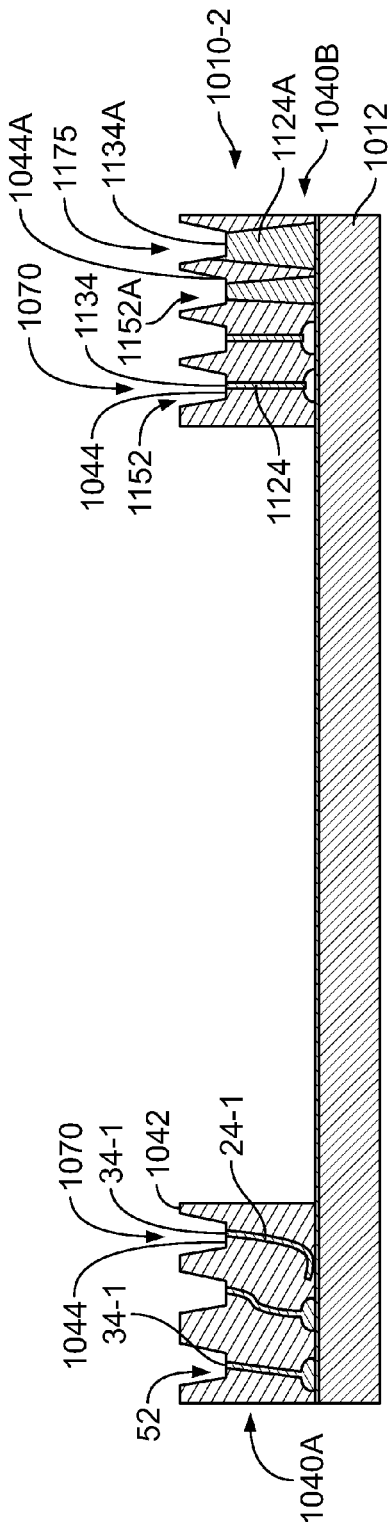
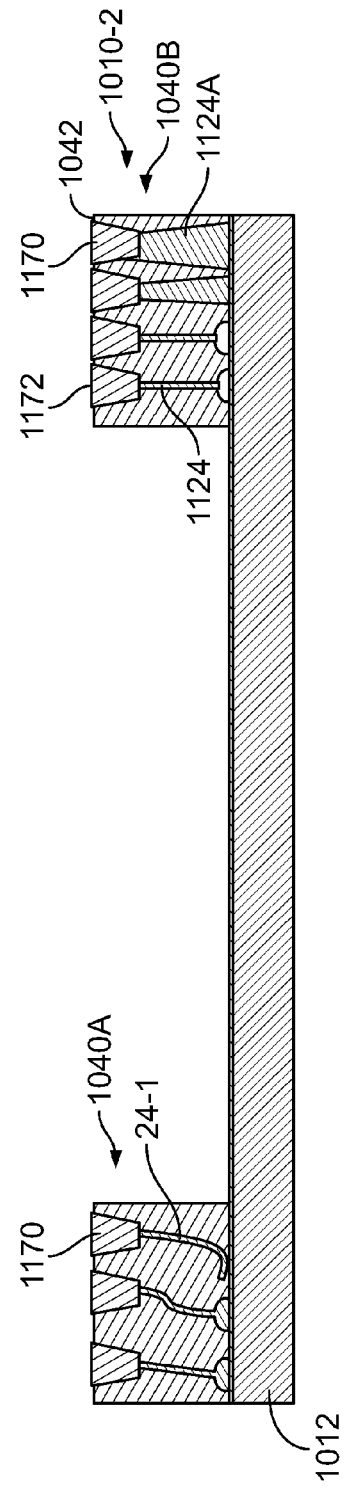
FIG. 16C
FIG. 16D

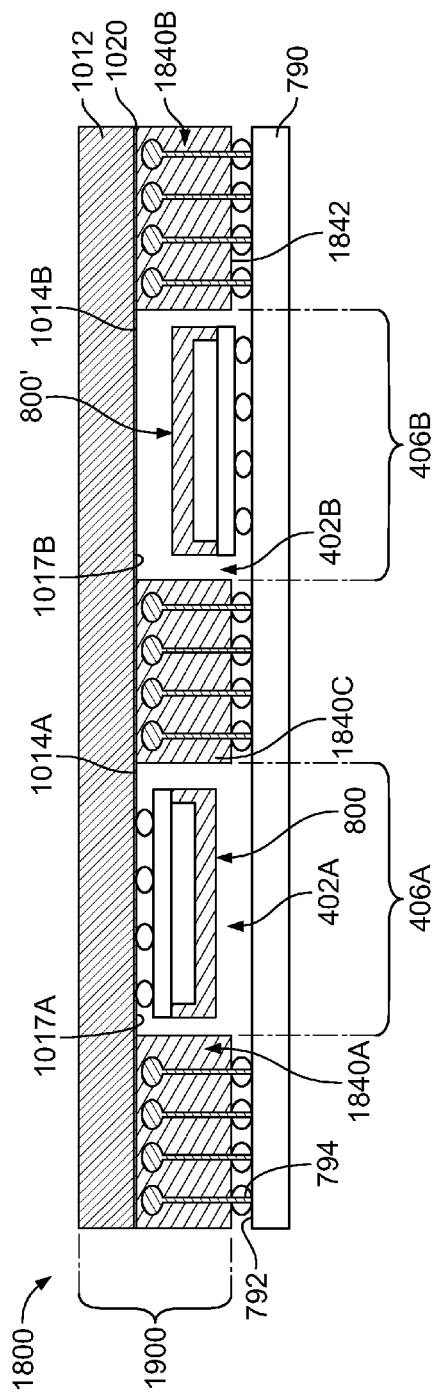
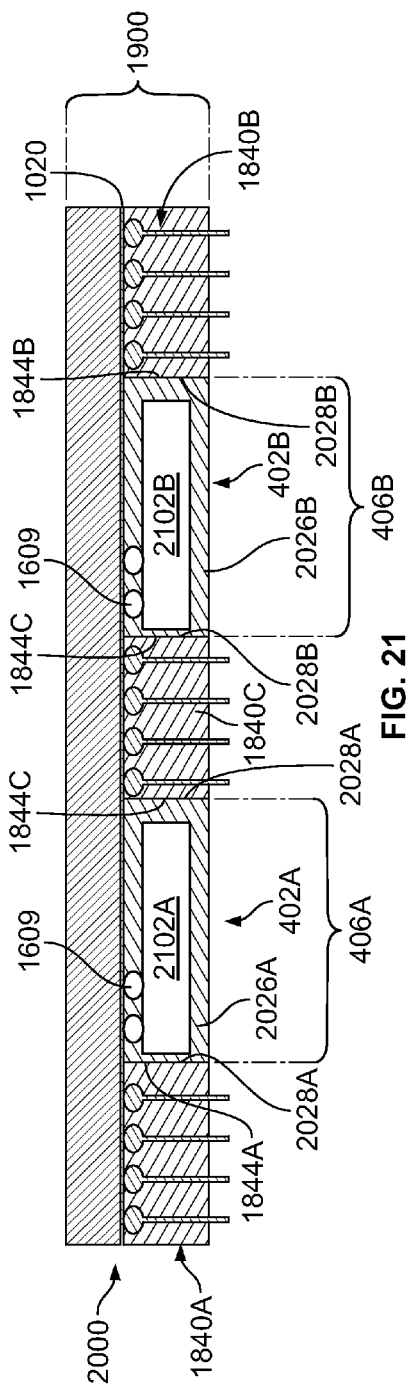

STRUCTURE FOR MICROELECTRONIC PACKAGING WITH BOND ELEMENTS TO ENCAPSULATION SURFACE

CROSS-REFERENCE TO RELATED APPLICATIONS

The present application is a continuation of U.S. application Ser. No. 13/722,189, filed Dec. 20, 2012, now U.S. Pat. No. 8,878,353, the disclosure of which is incorporated herein by reference.

FIELD OF THE INVENTION

The present invention relates to structures for microelectronic packaging.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts at the front surface. The contacts are electrically connected to the numerous electronic circuit elements formed integrally within the chip. Such a chip most commonly is provided in a package having a miniature circuit panel referred to as a substrate. The chip is typically mounted to the substrate with the front or rear surface overlying a surface of the substrate, and the substrate typically has terminals at a surface of the substrate. The terminals are electrically connected to the contacts of the chip. The package typically also includes some form of covering overlying the chip on the side of the chip opposite from the substrate. The covering serves to protect the chip and, in some cases, the connections between the chip and the conductive elements of the substrate. Such a packaged chip may be mounted to a circuit panel, such as a circuit board, by connecting the terminals of the substrate to conductive elements such as contact pads on the larger circuit panel.

In certain packages, the chip is mounted with its front or back surface overlying an upper surface of the substrate, whereas terminals are provided on the oppositely facing lower surface. A mass of a dielectric material overlies the chip and, most typically, the electrical connections between the chip and the conductive elements of the substrate. The dielectric mass may be formed by molding a flowable dielectric composition around the chip so that the dielectric composition covers the chip and all or part of the top surface of the substrate. Such a package is commonly referred to as an "overmolded" package, and the mass of dielectric material is referred to as the "overmold." Overmolded packages are economical to manufacture and thus are widely used.

In some applications, it is desirable to stack chip packages on top of one another, so that plural chips may be provided in the same space on the surface of the larger circuit panel. Also, it is desirable to have a large number of input/output interconnections to the chips. Certain overmolded packages incorporate stacking contacts at the top surface of the substrate outside of the area covered by the chip and, typically, outside of the area covered by the overmold. Such packages may be stacked one atop the other with interconnecting elements such as solder balls, elongated posts, wire bonds or other conductive connections extending between the stacking contacts of the lower package and the terminals of the next higher package in the stack. In such an arrangement, all of the packages in the stack are electrically connected to the terminals on the package at the bottom of the stack. In addition, because the substrate of the higher package in the stack sits above the dielectric overmold in the next lower package, there is an appreciable gap in the vertical direction between the terminals of the higher package and the stacking contacts of the lower package. The interconnecting elements must bridge this gap.

Despite the considerable effort devoted in the art to development of stackable packages and other packages having top-surface mounting pads, further improvement would be desirable.

SUMMARY OF THE INVENTION

In accordance with one embodiment, a structure may include a substrate having first and second oppositely facing surfaces and a plurality of electrically conductive elements at the first surface. In addition, the structure may include bond elements having bases joined to respective ones of the conductive elements at a first portion of the first surface and end surfaces remote from the substrate and the bases, where each of the bond elements extend from the base to the end surface thereof. Further the structure may include a dielectric encapsulation element overlying and extending from the first portion of the first surface of the substrate and filling spaces between the bond elements such that the bond elements are separated from one another by the encapsulation element, the encapsulation element having a third surface facing away from the first surface of the substrate and having an edge surface extending from the third surface towards the first surface, where unencapsulated portions of the bond elements are defined by at least portions of the end surfaces of the bond elements that are uncovered by the encapsulation element at the third surface, the encapsulation element at least partially defines a second portion of the first surface, the second portion being other than the first portion of the first surface and having an area sized to accommodate an entire area of a microelectronic element, and at least some of the conductive elements at the first surface are at the second portion and configured for connection with such microelectronic element.

In accordance with another embodiment, a method of making a structure may include forming a dielectric encapsulation element on a substrate, the substrate having first and second oppositely facing surfaces and a plurality of electrically conductive elements at the first surface, where bond elements are joined at bases thereof to respective ones of the conductive elements at a first portion of the first surface and end surfaces of the bond elements are remote from the substrate and the bases, each of the bond elements extending from the base to the end surface thereof, where the dielectric encapsulation element is formed overlying and extending from the first portion of the first surface of the substrate and filling spaces between the bond elements such that the bond elements are separated from one another by the encapsulation element, the encapsulation element having a third surface facing away from the first surface of the substrate and having an edge surface extending from the third surface towards the first surface, where unencapsulated portions of the bond elements are defined by at least portions of the end surfaces of the bond elements that are uncovered by the encapsulation element at the third surface, where the encapsulation element at least partially defines a second portion of the first surface, the second portion being other than the first portion of the first surface and having an area sized to accommodate an entire area of a microelectronic element, and at least some of the conductive elements at the first surface are at the second portion and configured for connection with such microelectronic element.

In accordance with another embodiment, a structure may include an active die having first and second oppositely facing surfaces and a plurality of electrically conductive elements at the first surface. In addition, the structure may include bond elements having bases joined to respective ones of the conductive elements at a first portion of the first surface and end surfaces remote from the die and the bases, each of the bond elements extending from the base to the end surface thereof. Further, the structure may include a dielectric encapsulation element overlying and extending from the first portion of the first surface of the die and filling spaces between the bond elements such that the bond elements are separated from one another by the encapsulation element, the encapsulation element having a third surface facing away from the first surface of the die and having an edge surface extending from the third surface towards the first surface, wherein unencapsulated portions of the bond elements are defined by at least portions of the end surfaces of the bond elements that are uncovered by the encapsulation element at the third surface. The encapsulation element may at least partially define a second portion of the first surface, the second portion being other than the first portion of the first surface and having an area sized to accommodate an entire area of a microelectronic element, and at least some of the conductive elements at the first surface are at the second portion and configured for connection with such microelectronic element.

In accordance with another embodiment, a method of making a structure may include forming a dielectric encapsulation element on an active die provided at wafer level. The die may have first and second oppositely facing surfaces and a plurality of electrically conductive elements at the first surface, where bond elements may be joined at bases thereof to respective ones of the conductive elements at a first portion of the first surface and end surfaces of the bond elements are remote from the substrate and the bases, each of the bond elements extending from the base to the end surface thereof, where the dielectric encapsulation element is formed overlying and extending from the first portion of the first surface of the die and filling spaces between the bond elements such that the bond elements are separated from one another by the encapsulation element, the encapsulation element having a third surface facing away from the first surface of the die and having an edge surface extending from the third surface towards the first surface, where unencapsulated portions of the bond elements are defined by at least portions of the end surfaces of the bond elements that are uncovered by the encapsulation element at the third surface, and where the encapsulation element at least partially defines a second portion of the first surface, the second portion being other than the first portion of the first surface and having an area sized to accommodate an entire area of a microelectronic element, and at least some of the conductive elements at the first surface are at the second portion and configured for connection with such microelectronic element.

BRIEF DESCRIPTION OF THE DRAWINGS

FIG. 1 is a diagrammatic sectional view depicting a substrate used in a method of manufacturing a structure, according to an embodiment of the disclosure.

FIG. 2 is a diagrammatic sectional view depicting the substrate and associated elements at a later stage of manufacturing operations, according to an embodiment of the disclosure.

FIG. 3 is a diagrammatic sectional view depicting a structure made using the substrate and the associated elements of FIGS. 1-2, according to an embodiment of the disclosure.

FIG. 5 is a diagrammatic sectional view of another exemplary structure, according to an embodiment of the disclosure.

FIG. 6 is a diagrammatic sectional view of another exemplary structure, according to an embodiment of the disclosure.

FIG. 7A is a diagrammatic top plan view depicting the structure of FIG. 3.

FIGS. 7B-7C are diagrammatic top plan views depicting exemplary structures, in accordance with the disclosure.

FIG. 8 is a diagrammatic sectional view of an exemplary package assembly including the structure of FIG. 3, in accordance with the disclosure.

FIG. 9 is a diagrammatic sectional view of another exemplary package assembly including the structure of FIG. 3, in accordance with the disclosure.

FIG. 16A is a diagrammatic sectional view of an exemplary structure including an active die, according to an embodiment of the disclosure.

FIG. 16B is a diagrammatic sectional view of the structure of FIG. 16A at a later stage of manufacturing operations.

FIG. 16C is a diagrammatic sectional view of another exemplary structure including an active die, according to an embodiment of the disclosure.

FIG. 16D is a diagrammatic sectional view of the structure of FIG. 16C at a later stage of manufacturing operations.

FIG. 20 is a diagrammatic sectional view of an exemplary package assembly including a structure, in accordance with the disclosure.

FIG. 21 is a diagrammatic sectional view of an exemplary package assembly including a structure, in accordance with the disclosure.

DETAILED DESCRIPTION

Figure 4A:
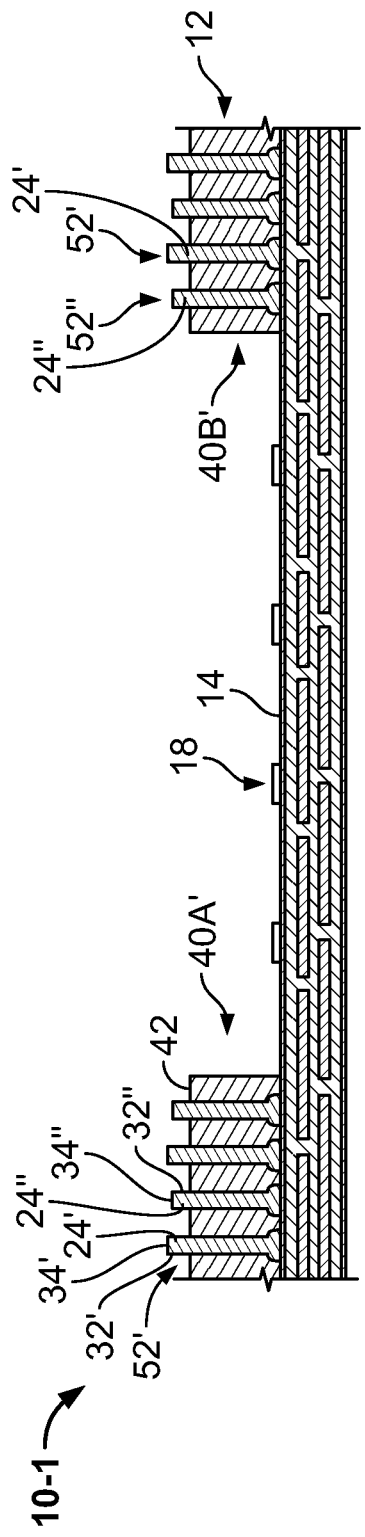
FIG. 4A is a diagrammatic sectional view of an exemplary structure, according to an embodiment of the disclosure.

A structure 10 (see FIG. 3) according to one embodiment of the disclosure may include a substrate 12 (see FIG. 1) having a first surface 14 and a second surface 16. The substrate 12 typically is in the form of a dielectric element, which is substantially flat. The dielectric element may be sheet-like and thin. In particular embodiments, the dielectric element may include one or more layers 23 of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. The first surface 14 and second surface 16 are preferably substantially parallel to each other and are spaced apart at a distance perpendicular to the surfaces 14 and 16 defining the thickness of the substrate 12. The thickness of substrate 12 is preferably within a range of generally acceptable thicknesses for the present application. In an embodiment, the distance between the first surface 14 and the second surface 16 is between about 25 and 500 μm. For purposes of this discussion, the first surface 14 may be described as being positioned opposite or remote from the second surface 16. Such a description, as well as any other description of the relative position of elements used herein that refers to a vertical or horizontal position of such elements is made for illustrative purposes only to correspond with the position of the elements within the Figures, and is not limiting.

Electrically conductive elements 18, which may include contacts or pads, traces or terminals, are at the first surface 14 of the substrate 12. As used in this disclosure, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In addition, as used in this disclosure a statement that an electrically conductive element is "at" a surface of a circuit panel, a microelectronic element such as a semiconductor chip or a like element, indicates that, when the panel or the element is not assembled with any other element, the electrically conductive element is available for contact with a theoretical point moving in a direction perpendicular to the surface of the panel or element toward the surface of the panel or element from outside the panel or element. Further, as used in this disclosure, a statement that a trace extends "along" a surface means that the trace extends in proximity to the surface and substantially parallel to the surface.

Traces 29 included as the conductive elements 18 may be formed as flat, thin, elongated strips of conductive material at the surface 14. In some embodiments, the traces may be formed integrally with and extend from terminals 27 included as the conductive elements 18 having a similar composition. In addition, contact pads 26 included as the conductive elements 16 on the surface 14 may be interconnected by traces 29 on the surface 14.

The terminals, pads or traces serving as the conductive elements 18 may be fabricated by numerous known methods, such as by plating the terminals, pads and traces onto the surface 14 of the substrate. In one embodiment, the traces may be embedded in the surfaces of the substrate, with the surfaces of the traces lying substantially flush with the surfaces of the substrate. In one embodiment, the conductive elements 18 may be formed from a solid metal material such as copper, copper, gold, nickel, or other materials that are acceptable for such an application, including various alloys including one or more of copper, gold, nickel or combinations thereof.

At least some of conductive elements 18 may be interconnected with second conductive elements 20, which may include conductive pads, traces or terminals similarly as described with respect to the conductive elements 18, at the second surface 16 of the substrate 12. Such an interconnection may be completed using vias 22 formed in the substrate 12 that may be lined or filled with conductive metal that may be of the same material as the conductive elements 18 and 20. The vias 22 in the substrate 12 desirably are fully closed by traces at the surfaces 14 or 16 of the substrate 12 or traces 19 within the substrate 12. The substrate 12 may include a plurality of dielectric material layers 23 with a layer of traces 19 disposed between adjacent ones of the layers 23. Contact pads 25 and terminals 31 included as the conductive elements 18 may be further interconnected by traces 33 on the surface 16 also serving as the conductive elements 18.

Referring to FIG. 2, the structure 10 may further include a plurality of bond elements 24 joined with at least some of the conductive elements 18, such as on pads 26 thereof, at a portion 50 of the surface 14. The portion 50 may include one or more areas of the surface 14, such as portions 50A and 50B as shown in FIG. 7A. The bond elements 24 are joined at a base 28 thereof to the pads 26 and may extend to a free end 30 remote from the respective bases 28 and from the substrate 12. The ends 30 of the bond elements 24 are characterized as being free in that they are not electrically connected or otherwise joined to a microelectronic element electrically connected to the conductive elements 18 at the surface 14 or any other conductive features within a microelectronic assembly including the structure 10 that are, in turn, connected to such microelectronic element. In other words, the free ends 30 are available for electronic connection, either directly or indirectly as through a solder ball or other features discussed herein, to a conductive feature external to a microelectronic assembly including the structure 10. The fact that the ends 30 may be held in a predetermined position by, for example, an encapsulant material, such as forming a dielectric encapsulation element 40 as discussed below in the text accompanying the description of FIGS. 3 and 4A-4D, or otherwise joined or electrically connected to another conductive feature, does not mean that they are not "free" as described herein, so long as any such feature is not electrically connected to a microelectronic element joined with the conductive elements at the surfaces, such as the surfaces 14 or 16, to which the bases thereof are joined. Conversely, base 28 is not free as it is either directly or indirectly electrically connected to a microelectronic element connected at the surfaces 14 or 16, as described herein.

As shown in FIG. 2, the base 28 may be substantially rounded in shape, extending outward from an edge surface 32 of the bond element 24, which may be a wire bond, defined between the base 28 and the end 30. The particular size and shape of the base 30 may vary according to the type of material used to form the wire bond 24, the desired strength of the connection between the wire bond 24 and the conductive element 18, or the particular process used to form the wire bond 24. Exemplary methods for making the wire bonds 24 are described in U.S. Pat. No. 7,391,121 to Otremba and in U.S. Pat. App. Pub. No. 2005/0095835, the disclosures of which are both incorporated herein by reference in their entireties. In an alternative embodiment, some of the wire bonds 24 may be joined to conductive elements 20 at the second surface 16 of substrate 12, through the conductive elements 19 and conductive material in the vias 22 within the substrate 12.

The bond elements 24 may be made from a conductive material such as copper, gold, nickel, solder, aluminum or the like. Additionally, the bond elements 24 may be made from combinations of materials, such as from a core of a conductive material, such as copper or aluminum, for example, with a coating applied over the core. The coating may be of a second conductive material, such as aluminum, nickel or the like. Alternatively, the coating may be of an insulating material, such as an insulating jacket. In an embodiment, the wire used to form bond elements 24 may have a thickness, i.e., in a dimension transverse to the wire's length, of between about 15 μm and 150 μm.

In other embodiments, including those in which wedge bonding is used, wire bonds 24 may have a thickness of up to about 500 μm. In general, a wire bond is formed on a conductive element, such as conductive element 26 that is a pad or the like, using specialized equipment that is known in the art. A leading end of a wire segment is heated and pressed against the receiving surface to which the wire segment bonds, typically forming a ball or ball-like base 28 joined to the surface of the pad 26. The desired length of the wire segment to form the wire bond is drawn out of the bonding tool, which may then cut the wire bond at the desired length. Wedge bonding, which may be used to form wire bonds of aluminum, for example, is a process in which the heated portion of the wire is dragged across the receiving surface to form a wedge that lies generally parallel to the surface. The wedge-bonded wire bond may then be bent upward, if necessary, and extended to the desired length or position before cutting. In a particular embodiment, the wire used to form a wire bond may be cylindrical in cross-section. Otherwise, the wire fed from the tool to form a wire bond or wedge-bonded wire bond may have a polygonal cross-section such as rectangular or trapezoidal, for example.

The free end 30 of the wire bond 24 has an end surface 34. The end surface 34 may form at least a part of a contact in an array formed by respective end surfaces 34 of a plurality of wire bonds 24.

Referring to FIG. 3, the structure 10 may further include encapsulation elements 40A and 40B formed from a dielectric material. In the embodiment of FIG. 3, the encapsulation elements 40 may be formed over the portion 50 of the first surface 14 of the substrate 12, and define a top surface 42 remote and facing away from the substrate 12. The material of the element 40 fills spaces between the bond elements 24, such that the bond elements 24 are separated from one another by the material of the encapsulation elements 40. Unencapsulated portions 52 of the bond elements 24 are defined by at least a portion of the end 30 of the bond elements 24, desirably by the end surface 34 thereof, and are uncovered by the encapsulation elements 40, for example, at the surface 42.

In a particular embodiment, the substrates of numerous structures are provided as a continuous or semi-continuous element such as a strip, tape or sheet, although in FIGS. 1-2 there are no visible borders between the individual substrates. After the encapsulation elements 40 are formed on the substrates, the structures 10 are then severed along lines of separation 62 (see FIG. 2 which does not show visible borders between the individual substrates) to yield the individual structure 10 having the configuration illustrated in FIG. 3, and where the substrate 12 of the structure 10 extends between opposing edges 64. FIGS. 1-2 depict only a portion of a substrate sheet suitable for making a plurality of structures that may accommodate a microelectronic element over a defined portion of the substrate thereof, as described in detail below.

Referring to FIG. 3, the encapsulation elements 40A and 40B may define first edge surfaces 44A and 44B, respectively, extending downwardly from a top border 56 adjacent the top surface 42 to a bottom border 58 adjacent the substrate 12 and disposed inside the edges 64 of the substrate 12. Further referring to FIG. 7A, bottom border 58 is disposed within a horizontal area 66 bounded by the edges 64 of the substrate. In one embodiment, the first edge surfaces 44A and 44B extend orthogonally from the surface 42 of the elements 40A, 40B, respectively, and the surface 14, and the surfaces 42 and 14 extend parallel to each other, such that the borders 56, 58 are aligned in a thickness direction of the structure 10.

In another embodiment, one or both of the first edge surfaces 44A and 44B may slope away from the top surface 42 in a horizontal direction toward the other element 40A or 40B opposite thereto, at an incline of less than 90 degrees with respect to the top surface 42, so that the bottom border 58 of the first edge surface 44 is further from the top surface 42 than the top border 56 in the horizontal direction toward the opposite element 40, similarly as described in U.S. application Ser. No. 13/674,280 filed Nov. 12, 2012, incorporated by reference herein.

In one embodiment, referring to FIG. 7A, the first edge surfaces 44 may be shaped such that any straight line extending along the first edge surface 44 at a constant vertical distance from the substrate 12 is disposed at a constant location in a first horizontal direction $H_1$. For example, an imaginary line 68 (FIG. 7A) extending at a constant vertical distance from the substrate would also lie at a constant horizontal location. In some embodiments, the first edge surfaces 44 may be substantially planar.

The elements 40A and 40B further may include second edge surfaces 46A and 46B, respectively, extending downwardly from the top surface 42 toward the substrate. The surfaces 46A, 46B, similar to the surfaces 44, may extend orthogonally from the surfaces 42 and 14, or alternatively may slope away from the surface 42 in horizontal directions $H_2$ and $H_1$, respectively. Similar to the edge surfaces 44, the edge surfaces 46 may be shaped such that any straight line extending along the surfaces 46 at a constant vertical distance from the substrate 12 is disposed at a constant location in the horizontal directions $H_2$ and $H_1$, respectively, similarly as described above for the edge surfaces 44.

The encapsulation elements 40 may have a thickness (h) of at least about 150 micrometers extending away from the surface 14 in a direction orthogonal to the horizontal directions $H_2$ and $H_1$. The encapsulation elements 40 may also cover some conductive elements 18 within the region 50, including pads 26 thereof, that are not otherwise covered by bond elements 24.

The encapsulation elements 40 may at least partially, and desirably substantially, encapsulate the wire bonds 24 joined with the conductive elements 26 within the region 50, including the bases 28 and at least a portion of the edge surfaces 32 of the bond elements. A portion of the wire bonds 24 may remain uncovered by the encapsulation element, which may also be referred to as unencapsulated, thereby making the wire bond 24 available for electrical connection to a feature or element located outside of encapsulation element 40. In an embodiment, end surfaces 34 of wire bonds 24 remain uncovered by the encapsulation element 40 at the surface 42 of the encapsulation element 42. Other embodiments are possible in which a portion of edge surface 32 is uncovered by encapsulation element 40 in addition to or as an alternative to having end surface 34 remain uncovered by encapsulation layer 40. In other words, encapsulation element 40 may cover all portions of components overlying the portion 50 of the first surface 14, with the exception of a portion of the wire bonds 24, such as at least the end surfaces 34, and optionally portions of the edge surfaces 32 or combinations of the two. In the embodiments shown in the drawings, the surface 42 of the encapsulation layer 40 may be spaced apart from first surface 14 of substrate 12 at a distance great enough to cover all but a portion of the bond element 24 at the end 30. Referring to FIG. 3, embodiments of the structure 10 may have end surfaces 30 of the wire bonds 24 other than flush with the surface 42, such as wire bonds 24 having ends that project from the surface 42 and terminate at end surfaces 34 that are at a same distance from the surface 42.

Alternatively, an embodiment of the disclosure may include a structure 10-1 as shown in FIG. 4A, which includes components similar to those of the structure 10 described above. Referring to FIG. 4A, the structure 10-1 may include encapsulation elements 40A' and 40B' each having a top surface 42 that is substantially planar and parallel to planar surface 14 of the substrate 12. The elements 40A' and 40B' may encapsulate wire bonds 24' and 24" having end surfaces 34' and 34", respectively, at different distances from the surface 42, and define unencapsulated portions 52' and 52" including the end surfaces 34' and 34" and portions of edges surfaces 32' and 32", respectively. In some embodiments, the end surface 34 of the bond element 24 may be planar and an edge surface 32 thereof may be planar and extend perpendicular to the end surface 34.

Figure 4B:
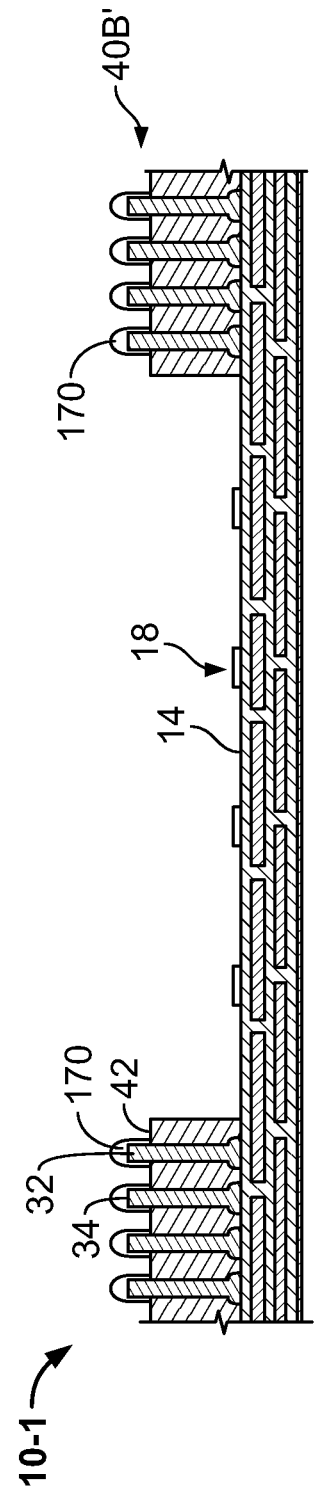
FIG. 4B is a diagrammatic sectional view of the structure of FIG. 4A at a later stage of manufacturing operations.

The configuration of the bond elements 24 having the unencapsulated portions 52, such as shown in FIGS. 3 and 4A, may provide for a connection, such as by a solder ball 170 or the like as shown in FIG. 4B, to another conductive element by allowing the solder to wick along edge surfaces 32 and join thereto in addition to joining to end surfaces 34. The solder ball 170 also may extend onto uncovered portions of the surface 42 from the edge surfaces 32.

Figure 4C:
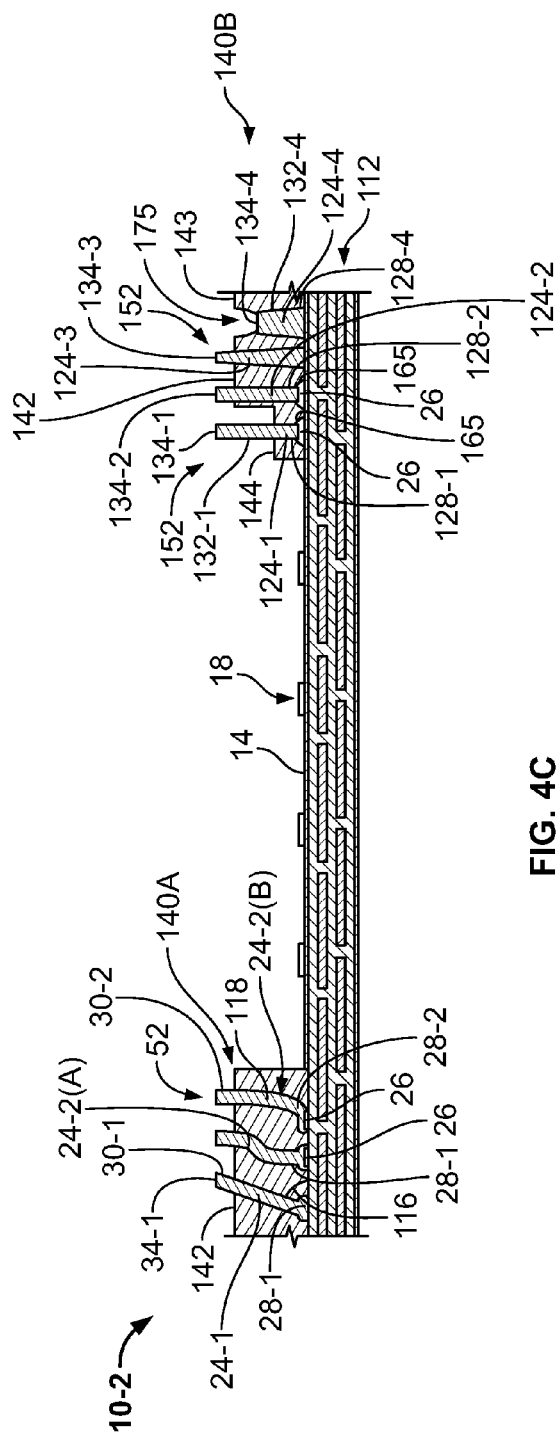
FIG. 4C is a diagrammatic sectional view of another exemplary structure, according to an embodiment of the disclosure.

Other configurations for bond elements 24 encapsulated by encapsulation elements 40 of a structure according to the disclosure also are possible. For example, FIG. 4C shows an embodiment of a structure 10-2 having a wire bond 24-1 encapsulated by an encapsulation element 140A with an end 30-1 thereof that is not positioned directly above base 28-1 thereof. That is, considering the first surface 14 of the substrate 12 as extending in two lateral directions, so as to substantially define a plane (see FIG. 7A), an end 30-1 of a wire bond 24-1 extending through the encapsulation element 140A may be displaced in at least one of these lateral directions from a corresponding lateral position of base 28-1. As shown in FIG. 4C, the wire bond 24-1 may be substantially straight along the longitudinal axis thereof, as in the embodiment of FIGS. 3 and 4A, with the longitudinal axis being angled at an angle 116 with respect to the first surface 14 of the substrate 12. Although the cross-sectional view of FIG. 4C only shows the angle 116 through a first plane perpendicular to the first surface 14, the wire bond 24-1 may also be angled with respect to the first surface 14 in another plane perpendicular to both that first plane and to the first surface 14. Such an angle may be substantially equal to or different than angle 116. That is the displacement of end 30-1 relative to base 28-1 may be in two lateral directions and may be by the same or a different distance in each of those directions.

In an embodiment, various ones of wire bonds 24-1 and 24-2 encapsulated by the element 140A may be displaced in different directions and by different amounts along the first surface 14 and within the encapsulation element 140A. Such an arrangement allows the structure 10-2 to have an array that is configured differently at the level of the surface 142 of the element 140A compared to at the level of substrate 12. For example, an array may cover a smaller or larger overall area or have a smaller or larger pitch at the surface 142 level compared to that at the first surface 14 of the substrate 12. Further, some wire bonds 24-1 may have ends 30-1 positioned above the substrate 12 to accommodate a stacked arrangement of packaged microelectronic elements of different sizes. In another example, the wire bonds 24-1 may be configured such that the end 30-1 of one wire bond 24-1 is positioned substantially above the base 28-1 of another wire bond 24-1, and the end 30-1 of the another wire bond 24-1 is positioned elsewhere. Such an arrangement may be referred to as changing the relative position of a contact end surface 34 within an array of contacts, compared to the position of a corresponding contact array on another surface, such as the surface 14. Within such an array, the relative positions of the contact end surfaces may be changed or varied, as desired, depending on application of a microelectronic assembly formed from the structure 10-2 or other requirements.

In a further example as shown in FIG. 4C, wire bonds 24-1 encapsulated by the element 140A may be arranged such that the bases 28-1 are arranged in a first pattern having a pitch thereof. The wire bonds 24-1 may be configured such that the unencapsulated portions 52 thereof, which include end surfaces 30-1, may be disposed in a pattern at positions at the surface 142 of the encapsulation element 140A which have a minimum pitch that is greater than a minimum pitch between the respective adjacent bases 28-1 of the wire bonds 24-1 attached to conductive pads 26 within the region 50. Accordingly, the minimum pitch between adjacent wire bonds at the surface 142 may be greater than the corresponding minimum pitch between the conductive pads 26 of the substrate to which the wire bonds are attached. To achieve this, the wire bonds may be angled or curved as shown, for example, in FIG. 4C, such that the ends 30 are displaced in one or more lateral directions from the bases 28, as discussed above. In one embodiment, the conductive elements 26 and the ends 30 may be arranged in respective rows or columns and the lateral displacement of end surfaces 34 in one row may be greater than in another row. To achieve this, the wire bonds 24 can, for example be at different angles 116 with respect to the surface 14 of the substrate 12.

FIG. 4C shows a further embodiment in which wire bonds 24-2 have ends 30-2 in displaced lateral positions with respect to the bases 24-2 thereof. In the embodiment of FIG. 4C, the wire bonds 24-2 achieve this lateral displacement by including a curved portion 118 therein. The curved portion 118 may be formed in an additional step during a wire bond formation process and may occur, for example, while the wire portion is being drawn out to the desired length. This step may be carried out using available wire-bonding equipment, which may include the use of a single machine.

The curved portions 118 may take on a variety of shapes, as needed, to achieve the desired position of the end 30-2 of the wire bond 24-2. For example, as shown in FIG. 4C, the curved portions 118 may be formed as S-curves of various shapes, such as included in wire bond 24-2(A), or of a smoother form as in wire bond 24-2(B). Additionally, the curved portion 118 may be positioned closer to base 28-2 than to end 30-2 or vice-versa. The curved portion 118 may also be in the form of a spiral or loop, or may be compound including curves in multiple directions or of different shapes or characters.

In one embodiment, the structure 10-2 may include encapsulation elements 140 each having a different type of bond elements 24 encapsulated therein. Referring to FIG. 4C, the element 140A may include wire bonds or wires as the bond elements 24, and encapsulation element 140B may include substantially vertical conductive features, such as micro-pillars or posts, as the bond elements 124.

It is to be understood that, as shown FIG. 4C, a structure may include any combination of bond elements having various shapes leading to various relative lateral displacements between bases and ends thereof. Some of the bond elements 24 are substantially straight with ends 30 positioned above their respective bases 28 as shown in FIG. 3 and FIG. 4A, while other bond elements 24 include a curved portion 118 leading to a somewhat slight relative lateral displacement between end 30 and base 28. Further, some bond elements 24 include curved portions 118 having a sweeping shape that result in ends 30 that are laterally displaced from the relative bases 28 at a greater distance than that of ends 28.

In such embodiments of the bond elements 24, wire bonds thereof may be configured to be uncovered by the encapsulation element at an end 30 and along at least a portion of the edge surface thereof extending away from the end surface 34. As shown in FIGS. 3 and 4A, 4C, free ends of the bond elements are uncovered, however, a portion of edge surface 32 may additionally or alternatively be uncovered by the encapsulation element. Such a configuration may be used for grounding of a microelectronic assembly including the structure by electrical connection to an appropriate feature or for mechanical or electrical connection to other features disposed laterally to the microelectronic assembly.

Additionally, referring to FIG. 4C, the encapsulation element 140B may encapsulate bond elements 124 that are in the form of posts or micro-pillars connected at bases 128 thereof with conductive elements 26 at the surface 14. The element 140B may be configured to include an area that has been etched away, molded, or otherwise formed to define a recessed surface 144 that is positioned closer to substrate 12 than the surface 142. One or more micro-pillars 124-1 may be uncovered within an area along the recessed surface 144. In the exemplary embodiment shown in FIG. 4C, end surface 134-1 and a portion of edge surface 132-1 of the micro-pillar 124-1 may be uncovered by encapsulation element 140B to form an unencapsulation portion 152 of the bond element 124-1.

In one embodiment, base 128-1 of a post 124-1 may be joined by a stud bump 165 with the conductive element 26 on the surface 14. The stud bump may consist essentially of one or more of copper, nickel, silver, platinum and gold ends 38 and provide a way of forming conductive interconnects when the post 124-1 is made from a non-wettable metal.

Figure 4D:
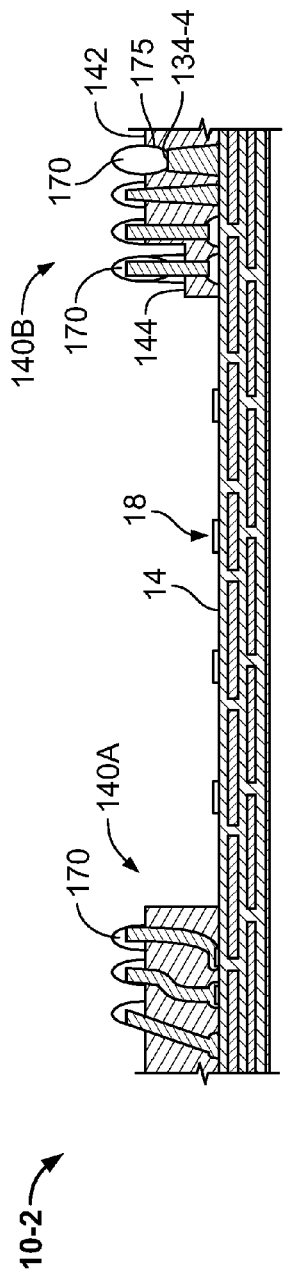
FIG. 4D is a diagrammatic sectional view of the structure of FIG. 4C at a later stage of manufacturing operations.

Similar to the bond elements 24, referring to FIG. 4D, such a configuration of the bond element 124 may provide a connection, such as by a solder ball 170 or the like, to another conductive element by allowing the solder to wick along edge surface 132-1 and join thereto in addition to joining to end surface 134-1, and where the solder may extend along the surface 144 from the edge surface 132-1. Other configurations by which a portion of the bond element 124 may be uncovered by encapsulation element 140B along recessed surface 144 are possible, including ones in which the end surfaces are substantially flush with recessed surface 144.

Referring again to FIG. 4C, the structure 10-2 may include a bond element 124-2 in the form of a micro-pillar having a base 128-2 joined by the stud bump 165 to a conductive element 26, and an end surface 134-2 and an edge surface 132-2 extending from the end surface 134-2 defining an unencapsulated portion 152 of the wirebond 124-2 at the surface 142. In another embodiment, the structure 10-2 may include a bond element 124-3 in the form of a micro-pillar formed integrally with the conductive element 26 at the surface 14 and extending from the surface 14 to an end surface 134-3. The bond element 124-3 includes the end surface 134-3 and an edge surface 132-3 extending therefrom as an unencapsulated portion 152 at the surface 142.

In a further embodiment, the element 140B may be configured to include an area that has been etched away, molded, or otherwise formed to define a cavity 175 extending from the surface 142 to the surface 14 of the substrate. The cavity 175 may have any suitable shape to permit electrical connection at an end surface 134-4 of a bond element 124-4 that may be formed in the cavity 175, such as by deposition of electrically conductive material therein, where the bond element 124-4 has an end surface 134-4 as the unencapsulated portion 152. In one embodiment, the bond element 124-4 may be formed in a trapezoidally shaped cavity 175, with tapered side walls. The bond element 124-4 may have an end surface 134-4 wider in cross-section than a cross-section of a portion between the base 128-4 and end surface 134-4, where the base 128-4 and end surface 134-4 are parallel and edge surfaces 132-4 extend tapered toward each other from the base 128-4 to the end surface 134-4.

Referring FIG. 4D, solder 170 may be deposited in the cavity 175 to extend from the end surface 134-4 to above the surface 142 and along portions of the surface 142 extending away from the cavity 175.

It is to be understand that, in accordance with the disclosure, a structure may include other configurations by which a portion of a bond element is uncovered by an encapsulation element, such at an end surface and optionally along an edge surface thereof, which are similar to those discussed herein with respect to the variations of the configuration of the surface of the encapsulation element remote and facing away from the surface of the substrate.

Referring again to FIG. 3, for example, the encapsulation elements 40 serve to protect conductive elements 18 within the region 50, including the bond elements 24 connected with the pads 26 within the region 50. This allows for a more robust structure that is less likely to be damaged by testing thereof or during transportation or assembly to other microelectronic structures. Encapsulation element 40 may be formed from a dielectric material with insulating properties such as that described in U.S. Patent App. Pub. No. 2010/0232129, which is incorporated by reference herein in its entirety.

Referring to FIGS. 3 and 7A, an exemplary pattern for an array of contacts formed by end surfaces 34 of the bond elements 24 of the structure 10 is shown. Such an array may be formed in an area array configuration, variations of which could be implemented using the structures described herein. Such an array may be used to electrically and mechanically connect a microelectronic assembly including the structure 10 to another microelectronic structure, such as to a printed circuit board ("PCB"), or to other packaged microelectronic elements. In such a stacked arrangement, wire bonds 24 and conductive elements 18 and 20 may carry multiple electronic signals therethrough, each having a different signal potential to allow for different signals to be processed by different microelectronic elements in a single stack. Solder masses may be used to interconnect the microelectronic assemblies in such a stack, such as by electronically and mechanically attaching end surfaces 34 to conductive elements of an external component.

Referring to FIGS. 3 and 7A, the surfaces 14 and 16 of the substrate 14 of the structure 10 extend in horizontal directions $H_1$ and $H_2$ and the edges 64 of the structure 90 extend between the upper and lower surfaces. The encapsulation elements 40A and 40B may define a microelectronic element receiving region 210 of predetermined size and predetermined shape to accommodate a microelectronic element, such as a semiconductor chip alone, a microelectronic assembly or a microelectronic package containing at least one chip, disposed laterally from the elements 40A and 40B and connected to the substrate 12 at a portion of the surface 14 that a bottom portion 212 of the region 210 overlies. For example, referring to FIG. 7A, the bottom portion 212 may have a linear dimension R1 extending in the horizontal direction $H_1$ from the bottom border 58 of the element 40A to the bottom border 58 of the element 40B, and a linear dimension R2 extending in a horizontal direction orthogonal to the direction $H_1$ between opposing ends 205 of the elements 40 extending in a direction parallel to the horizontal direction $H_1$. The region 210 includes a space that extends, at the bottom portion 212, upwardly from exposed portions of the surface 14 and conductive elements 18 at the surface face 14, to a predetermined vertical distance from the surface 14 of the substrate, which may be a height above, the same or below the height of the surface 42 of one or both of the elements 40 as measured vertically from the surface 14. The region 210, thus, includes a space defined between the surfaces 44A, 44B of the encapsulation elements 40A, 40B, respectively. The region 210 is of a predetermined size and shape that is based on size, shape and positioning of the encapsulation elements 40 on the surface 14 of the substrate, and provides that a portion of a microelectronic element by itself, or within a package or assembly, to be connected to a portion of the substrate that the portion 212 overlies may be disposed in the region 210 without the element, package or assembly contacting the surfaces 42A and 42B.

A process according to a further embodiment of the invention for manufacture of the structure 10 may use a pre-formed dielectric mass, such as a substrate consisting essentially of dielectric material, and use a mold element (not shown) to form a dielectric mass of the encapsulation element 40 that encapsulates the bond elements 24. In this process, the bond elements connected with pads 26 at the surface 14 of substrate 12 may be present at the time of molding. In one embodiment, the dielectric mass forming the element 40 may be molded over the bond elements 24, which are connected to traces 18 on the surface 14 of the substrate 12.

In addition, a pre-formed dielectric mass serving as the encapsulation element encapsulating the bond elements to define unencapsulated portions, and having a top surface 42 and edge surfaces 44 and 46, as described above and shown in FIG. 3, may be attached to the portion 50 of the surface 14 of the substrate 12, laterally spaced from another similar encapsulation element, using an adhesive, such as curable adhesive or epoxy.

In a further step of manufacture of the structure 10 before the encapsulation elements are formed on the substrate 12, traces and pads as the conductive elements 18 may be patterned onto the surface 14. For example, the entire surface 14 may be plated, masked and selectively etched to form the traces. Alternatively, the surface 14 may be covered with a mask material, and then selectively exposed to laser radiation to cut grooves through the mask. A seed layer may be applied over the mask and into the grooves, whereupon the mask is removed so as to lift off the seed layer everywhere except at the grooves. The surface is then exposed to a plating bath, so that metal is deposited only at the grooves where the seed is present. Any other technique for forming metallic features on a dielectric body may be used.

In other embodiments, flowable dielectric material used to form the encapsulation element 40 may serve as an adhesive which bonds the encapsulation element to the substrate 12.

Figure 7C:
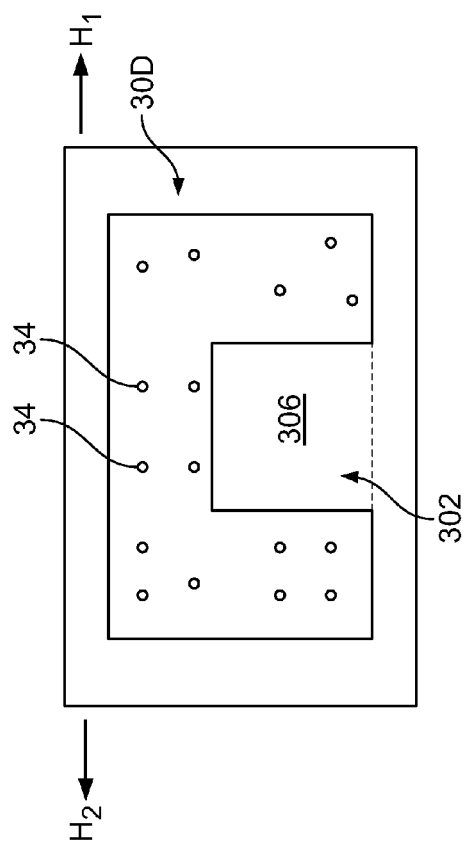
Figure 7D:
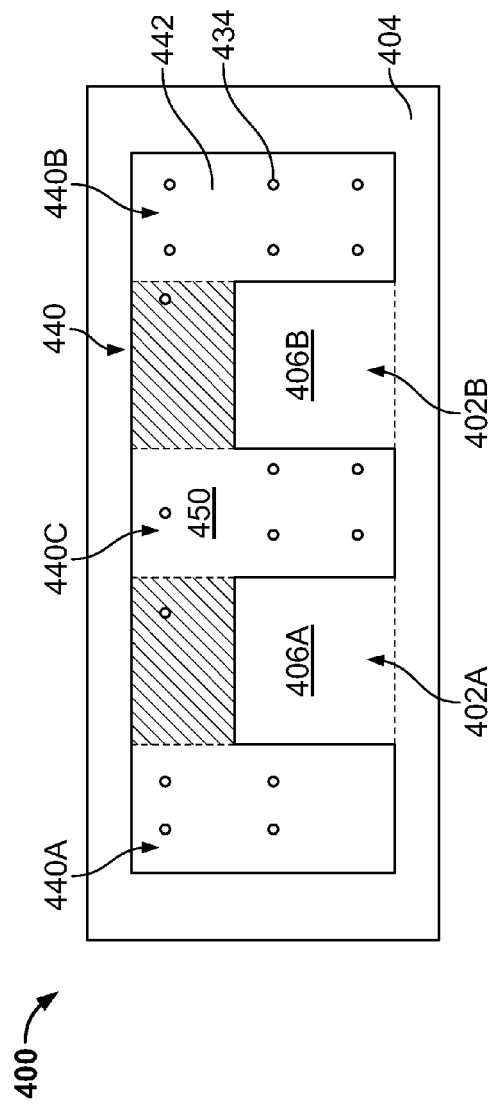
FIG. 7D is a diagrammatic top plan view depicting the structure of FIG. 5.
Figure 7E:
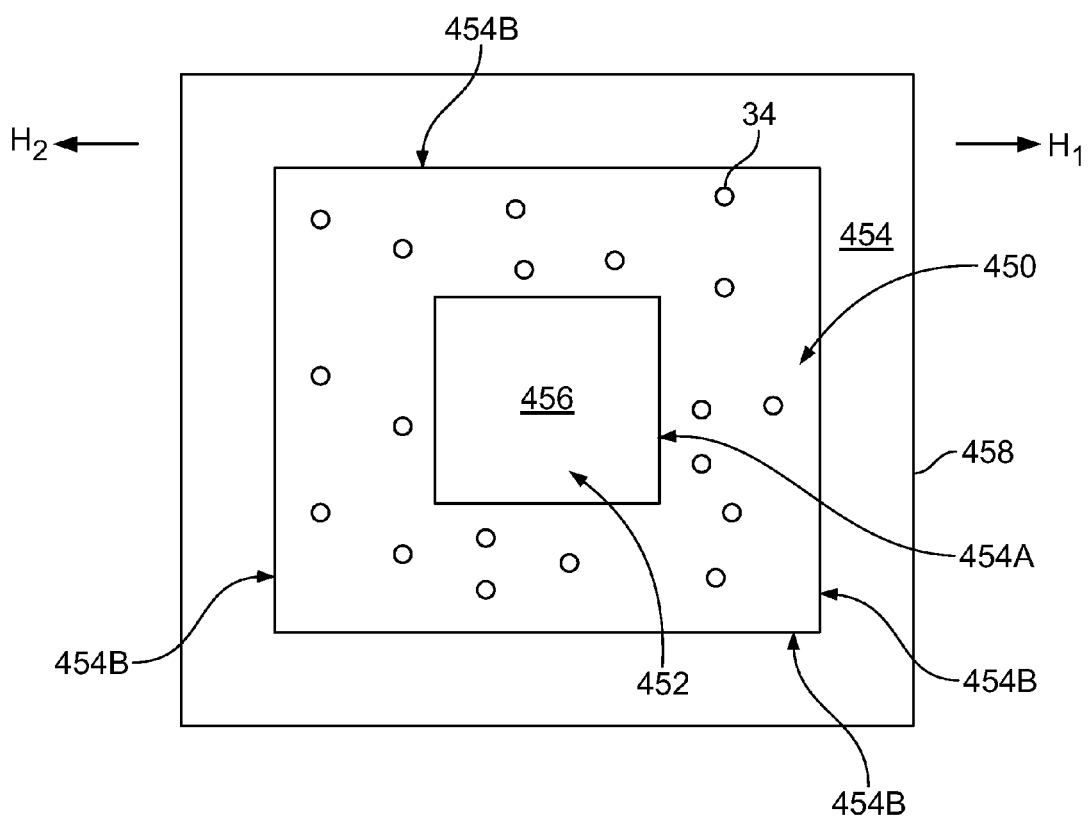
FIG. 7E is a diagrammatic top plan view depicting an exemplary structure, in accordance with the disclosure.

Referring to FIGS. 7B, 7C and 7E, alternative arrangements of encapsulation elements on a substrate, which encapsulate bond elements connected with the substrate, may be used to obtain a microelectronic element receiving region, in accordance with embodiments of the disclosure. For example, one or more encapsulation elements 300 may be formed on an upper surface 304 of a substrate 312, such as similar to the substrate 12, to have a size, shape and arrangement on the upper surface 304, such as relative to one another, to define a microelectronic element receiving region 302 of size and shape that may accommodate a microelectronic element, package or assembly, similarly as described above for the region 210. Referring to FIG. 7B, four encapsulation elements 300 may be arranged to define the region 302 overlying the upper surface 304 of the substrate 312 and having a bottom portion 306 having horizontally extending dimensions R3 and R4, where R4 is aligned in a thickness direction of the structure with the upper and lower borders of the elements 300A and 300B at the facing edge surfaces thereof, respectively, and R3 is aligned in the thickness direction of the structure with the upper and lower borders of elements 300C and 300D at the facing edge surfaces thereof, respectively. Referring to FIG. 7C, the encapsulation element 300 may be a single element that defines a region 302 having a rectangularly-shaped bottom portion 306, three sides of which are defined by the single element. Referring to FIG. 7E, a single encapsulation element 450 may be arranged overlying upper surface 454 of substrate 456 to define a microelectronic element receiving region 452 having a bottom portion 456 overlying a portion 454A of the surface 454. The element 450 overlies a portion 454B of the surface 454, and the portion 454B completely encloses the portion 454A. The element 450, as such, completely encloses the receiving region 452, at least at a portion of the region 452 that extends vertically away from the portion 454A.

Referring to FIGS. 5 and 7D, in one embodiment a structure 400, having components similar to those of the structure 10, may include a single encapsulation element 440, or multiple encapsulation sub-elements 440A, 440B and 440C, that encapsulate bond elements 424 to provide, at surfaces 442 of sub-elements 440 facing away from the substrate, unencapsulated portions 452 defined by at least end surfaces 434 of the bond elements 424. For example, referring to FIG. 7D, a single element 440 may define a plurality of microelectronic receiving regions 402A, 402B overlying upper surface 414 of the substrate and having bottom portions 406A, 406B, respectively. Alternatively, the sub-elements 440A, 440B and 440C (indicated in FIG. 7D by portions of the element 440 that do not have cross-hatching) may be arranged in parallel and spaced from each other, similarly as the elements 40A and 40B in FIGS. 3 and 4A, to define the regions 402A and 402B.

Referring to FIG. 6, in one embodiment a structure 500, having a construction similar to the structure 10, may include the encapsulation elements 40A, 40B on the surface 14 of the substrate 12 to define the region 210. In addition, an encapsulation element 540 may overlie a portion 560 of the surface 16 and encapsulate bond elements 524 joined to pads 522 within the portion 560, while providing for unencapsulated portions 550 defined by end surfaces 534 and portions of edge surfaces 532. In one embodiment, the encapsulation element 540 may at least partially overlie a portion of the surface 14 that the portion 212 overlies. In some embodiments, the encapsulation element 540 may overlie the surface 16 to define at least one microelectronic element receiving region 570 having a bottom portion 572 overlying a portion 574 of the surface 16 extending from the portion 560 to an opposing edge 64 of the substrate 12.

Figure 14:
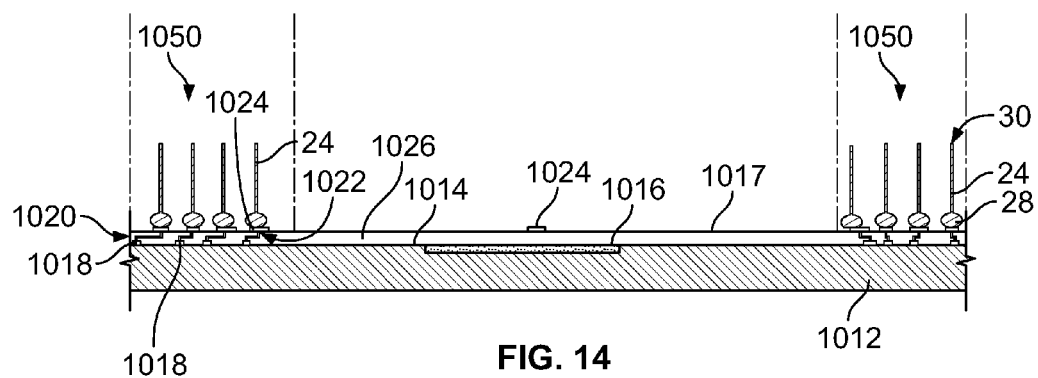
FIG. 14 is a diagrammatic sectional view depicting an active die and associated elements at a stage of manufacturing a structure, according to an embodiment of the disclosure.
Figure 15:
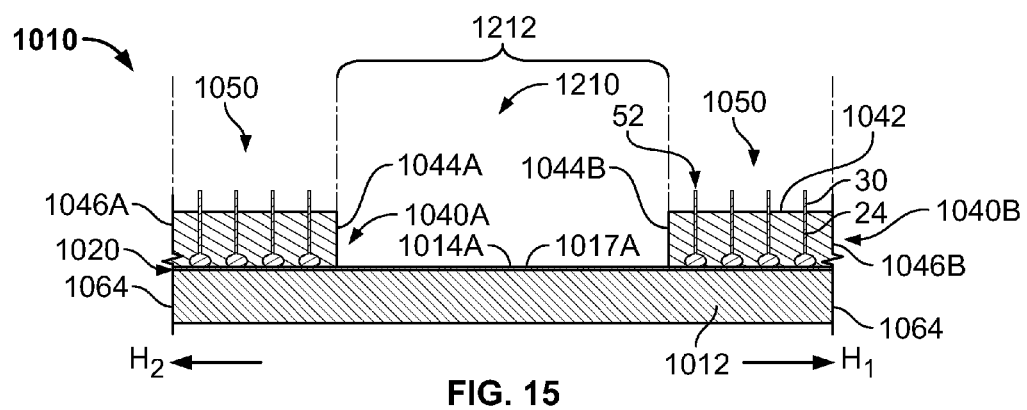
FIG. 15 is a diagrammatic sectional view depicting the structure made using the die and the associated elements of FIG. 14, according to an embodiment of the disclosure.

Referring to FIGS. 14 and 15, in another embodiment of the present disclosure a structure 1010 may include an active die 1012, such as a field programmable gate array, which is provided at the wafer level. The die 1012 may have an active surface 1014 including electrical circuitry 1016 and bond pads 1018. The die 1012 is typically silicon of thickness 730 micrometers, and the electrical circuitry 1016 may be provided by any suitable conventional technique. Alternatively, the die 1012 may be any other suitable material, such as, for example, gallium arsenide and may be of any suitable thickness. A redistribution layer 1020 of dielectric material may extend along the surface 1014. Traces 1022 may be electrically connected to contact pads 1024 at surface 1017 of the layer 1020, the surface 1017 being remote from the surface 1014, and extend through substrate 1026 of the redistribution layer 1020 to the pads 1018 at the surface 1014. Similar to the structure 10 as shown in FIG. 2, bond elements 24 may be joined at bases thereof with at least some of the pads 1024, which are joined through traces 1022 with pads 1018 at a portion 1050 of the surface 1014. In another embodiment where the redistribution layer 1020 is omitted from the structure, the bases 28 of the bond elements 24 may be joined by solder elements (not shown) with the pads 1018 at the portion 1050.

Referring to FIG. 15, the structure 1010 may further include encapsulation elements 1040A and 1040B, having features similar to the encapsulation elements 40 in the assembly 10 as described above, formed from a dielectric material over the portion 1050 of the surface 1014 of the substrate 12, and defining a top surface 1042 remote and facing away from the die 1012. The material of the element 1040 fills spaces between the bond elements 24, and unencapsulated portions 52 are defined by at least a portion of the ends 30 of the bond elements 24. In addition, the encapsulation elements 1040A and 1040B may define first edge surfaces 1044A and 1044B, respectively, extending downwardly adjacent the top surface 1042 to the surface 1017 of the redistribution layer 1020, or to the surface 1014 if the layer 1020 is omitted, where the surfaces 1044 are disposed inside peripheral edges 1064 of the die 1012. The elements 1040A and 1040B further may include second edge surfaces 1046A and 1046B, respectively, extending downwardly from the top surface 1042 to the surface 1017 of the layer 1020 or the surface 1014 of the die 1012, similarly as described above for the surfaces 46 of the elements 40 extending to the substrate 12. The encapsulation elements 1040 may be configured similarly as the encapsulation elements 40' and 140, as shown in FIGS. 4A and 4B, to encapsulate bond elements 24 and uncover unencapsulated portions 52 thereof.

In some embodiment, the dies of numerous structures are provided as a continuous or semi-continuous element such as a strip, tape or sheet. After the encapsulation elements 1040 are formed on the dies, the structures 1010 are then severed along lines of separation to yield the individual structure 1010 having the configuration illustrated in FIG. 15, and where the die 1012 of the structure 1010 extends between opposing edges 1064.

Alternatively, an embodiment of the disclosure may include a structure 1010-1, as shown in FIG. 16A, which includes components similar to those of the structure 1010 described above. Referring to FIG. 16A, the structure 1010-1 may include wire bonds 24-1, some of which may include curved or substantially straight portions similar to those shown in FIG. 4C, encapsulated by an encapsulation element 1040A with respective ends 30-1 thereof that are not positioned directly above bases 28-1 thereof, such that the structure 1010-1 may have an array that is configured differently at a level of the element 1040A, which is remote from the die 1012 compared to at the level of the die 1012 or the redistribution layer 1020. The element 1040A may be configured to include an area that has been etched away, molded, or otherwise formed to define a cavity 1070 extending from a surface 1042 of the element 1040A, which is remote from the die 1012, to a recessed surface 1044 that is positioned closer to the die 1012 than the surface 1042. The bond elements 24-1 may be uncovered in the cavity 1070 within an area along the recessed surface 1044. The cavity 1070 may have any suitable shape to permit electrical connection of the unencapsulated portion 52 at end 30-1 of a bond element 24-1 that is disposed in the cavity 1070. In one embodiment, the unencapsulated portion 52 of the bond element 24-1 may overlie the surface 1044, and be between tapered side walls 1045 of the encapsulation element 1040A extending from the surface 1042 to the surface 1044 that define the cavity 1070.

Additionally, the encapsulation element 1040B may encapsulate bond elements 1124 configured similar to the bond elements 124 as shown in FIG. 4C, and connected at bases 1128 thereof with pads at the surface 1017 of the redistribution layer 1020 or at the surface 1014 of the die 1012. In the exemplary embodiment shown in FIG. 16A, a bond element 1124 may be uncovered by encapsulation element 1040B to form an unencapsulation portion 1152 defined by an end surface 1134 and a portion of edge surface 1132 of the bond element within a cavity 1070 of the encapsulation element 1040B. In one embodiment, base 1128 of a post 1124 may be joined by a stud bump 1165 with a pad at the surface 1017 or 1014. Further, a cavity 1075, having a configuration similar to the cavity 175 as shown in FIG. 4C, may be formed in the encapsulation element 1040B and extend from the surface 1042 to the surface 1017, or the surface 1014 if the layer 1020 is omitted. A bond element 1124A, similar to the bond elements 124-2, 124-3 or 124-4, may extend from an end surface 1130A disposed within the cavity 1175, through the cavity 1175 to a base thereof joined with a pad of the die 1012 or layer 1020, where an unencapsulated portion 1152A of the bond element 1124A is defined by the end surface 1130A and an edge surface 1132A extending from the end surface 1130A.

Referring to FIG. 16B, the bond elements 1124 may provide a connection, such as by a solder element 1170 or the like, to another conductive element by allowing to fill the cavities 1070 or the portions of the cavities 1175 not occupied by the bond elements 1124, so as to encapsulate the unencapsulated portions 52 and 1152 of the bond elements 24-1 and 1124, respectively. In some embodiments, the material forming the solder elements 1170 may be formed on portions of the surface 1042 extending from the cavities 1070 and 1175. In another embodiment, a surface 1172 of the solder element 1170, remote from the die 1012, may be in a same plane as planar surface 1042 of the encapsulation element 1040.

In another embodiment, a structure 1010-2 (see FIG. 16C) may have components and a configuration similar to the structure 1010-1, except for the following differences. The bond elements 24-1 may be encapsulated by the encapsulation element 1040A such that only the end surfaces 34-1 of the elements 24-1 define the unencapsulated portions 52 thereof, and the end surfaces 34-1 are flush with the surfaces 1044. In addition, the bond elements 1124 having the unencapsulated portions 1152 may be encapsulated by the encapsulation element 1040B such that only the end surfaces 1134 of the elements 1124 define the unencapsulated portions 1152, and the end surfaces 1134 are flush with the surfaces 1044. Further, the bond elements 1124A may be encapsulated by the encapsulation element 1040B such that only the end surfaces 1134A thereof define the unencapsulated portions 1152A, and the end surfaces 1134A are flush with the surfaces 1044. Referring to FIG. 16D, and similarly as described with reference to FIG. 16C, solder elements 1170 may fill the cavities 1070 or the portions of the cavities 1175 not occupied by the bond elements 1124, so as to encapsulate the unencapsulated portions 52 and 1152 of the bond elements 24-1 and 1124, respectively.

In some embodiments, the encapsulation elements overlying the substrate 112, such as in the structures 10 as described above (see FIGS. 3 and 4A-4D), may be configured to encapsulate bond elements and uncover unencapsulated portions 52 similarly as the encapsulation elements overlying the die 1012 in the embodiments of the structures 1010 as shown in FIGS. 16A-16D.

Referring to FIGS. 15 and 7E, similarly as described above for the structure 10, the encapsulation elements 1040A and 1040B may define a microelectronic element receiving region 1210 of predetermined size and predetermined shape to accommodate a microelectronic element, such as a semiconductor chip alone, a microelectronic assembly or a microelectronic package containing at least one chip, disposed laterally from the elements 1040A and 1040B and electrically connected with pads of the die 1012 at a portion of the surface 1014 that a bottom portion 1212 of the region 1210 overlies. For example, referring to FIG. 7E, the encapsulation elements 1040A and 1040B may be in the form of a single, integral encapsulation element 1040, having a configuration similar to the element 450, that overlies an area of the die 1012 that completely encloses an area 1014A or 1017A of the surfaces 1014 or 1017, so to define the region 1210. The region 1201 may have a configuration similar to the region 452 and include a portion 1212, similar to the bottom portion 456, adjacent the die 1012. The region 1210 is of a predetermined size and shape that is based on size, shape and positioning of the encapsulation elements 1040 over the surface 1014 of the die 1012, and provides that a portion of a microelectronic element by itself, or within a package or assembly, to be connected to a portion of the die that the portion 1212 overlies may be disposed in the region 1210 without the element, package or assembly contacting the surfaces 1042A and 1042B.

Referring to FIG. 8, a package assembly 600 may include a structure of the present disclosure connected to a microelectronic element, package or assembly at the microelectronic element region of the structure. The package assembly 600, for example, may include the structure 10 as described above, connected to a microelectronic element 602. The microelectronic element or chip 602 may include oppositely facing surfaces 605, 607, and be positioned in a "face-down" orientation relative to the substrate 12 in the region 212, with the surface 605 facing the surface 14 of the substrate 12. Contacts 604 at the surface 605 may be bonded by solder elements 609 to conductive elements 618 at the surface 14. The bottom portion 212 of the region 210 overlies the conductive elements 618. The contacts 604 may be electrically connected with terminals 31 from which traces 33 extend on the surface 16 of the substrate 12, and the bond elements 24 within the elements 40A and 40B, through electrical circuitry, such the traces 19 within or the conductive vias 22 extending through, the substrate 12. The assembly 600 may be joined to an external component 690, such as a printed circuit board, by electrically connecting solder elements 625, such as solder balls, formed at the terminals 31 to contacts (not shown) on a facing surface 692 of the component 690 arranged in a pattern corresponding to that of the terminals 31 of the structure 10.

In one embodiment, the region 210 may be adapted such that, when the microelectronic element 602 is bonded to the substrate 12, opposing edge surfaces 613A and 613B of the microelectronic element 602 that face the edge surfaces 44A and 44B, respectively, are spaced a distance of at least about 200 microns from the edge surfaces 44A, 44B. In some embodiment, the distance of the spacing may permit that dielectric material, for example, underfill, may be provided between the facing surfaces 613A and 44A and the facing surfaces 613B and 44B. In another embodiment, the distance of the spacing may permit molding of dielectric material over the top surface 607 of the microelectronic element 602, which extends between the surfaces 613A and 613B, and the surfaces 613A and 613B.

A dielectric mass or overmold 626 is formed over the bottom portion 212 of the region 210, such as using any of the techniques described to form the dielectric masses of the encapsulation elements over the substrate 12 discussed above. The dielectric mass 626 has a top surface 628 remote from the surface 14 that extends over the microelectronic element 602 and away from the element 602 over the surface 14 in the horizontal directions $H_1$ and $H_2$ toward the edge surfaces 44A and 44B of the encapsulation elements 40A and 40B, respectively. In one embodiment, the top surface 628 extends to the edge surfaces 44A and 44B, and edges surfaces 628A and 628B extend downwardly therefrom to the substrate 12 facing, and in some embodiments along and contacting at least portions of, portions of the edge surfaces 44A and 44B, respectively. As such, the dielectric mass 626 may be made from a first dielectric material, and the encapsulation elements 40 may be made from a second dielectric material that is different from the first dielectric material. In some embodiments, the dielectric mass 626 may be provided such that the top surface 628 thereof extends over a portion of the surface 42 of an encapsulation element 40. The dielectric mass 626 further includes a bottom surface 630 extending from the edges surfaces 628A and 628B in horizontal directions $H_1$ and $H_2$ away from the encapsulation elements 40A and 40B and along exposed portions of the surface 14 and traces 618 on the surface 14.

In one embodiment, a thickness (h) of the encapsulation elements 40, in a thickness direction T of the assembly 600 orthogonal to $H_1$ and $H_2$, extends upwardly away from the surface 14, and is the same as, greater than, or less than a thickness of the microelectronic element 602 in the direction T. In another embodiment, the thickness (h) of at least one of the elements 40 is less than or equal to the thickness in the direction T of the dielectric mass 626 with the microelectronic element 602 encapsulated therein.

The assembly 600 may be joined with a microelectronic package 2200 that overlies the surface 14 of the substrate 12. The package 2200 may include a substrate 2206 having a first surface 2208 remote from a second surface 2210, where the first surface 2208 faces the surface 42 of the encapsulation elements 40 and the surface 628 of the mass 626. Conductive elements 2212 may extend along the surfaces 2208 and 2210. In addition, a microelectronic element 2214 is positioned in a "face down" orientation facing the surface 2210, and contacts (not shown) of the microelectronic element 2214 are bonded to the conductive elements 2212 on the surface 2210 by solder elements (not shown). Further, the conductive elements 2212 on the surface 2208 may be arranged in a pattern corresponding to the pattern of the unencapsulated portions 52 of the bond elements 24, and solder elements 2215 may electrically connect such elements 2212 with the unencapsulated portions 52. A dielectric mass 2220 may be formed over the microelectronic element 2214 and uncovered portions of the surface 2210 to encapsulate the element 2202 and the surface 2210 of the substrate 2206, such as using any of the techniques described to form a dielectric mass. A surface 2222 of the mass 2220, remote from the substrate 2206, overlies the microelectronic element 2214 and portions of the surface 2210 adjacent the element 2214. As such, the bond elements 24 may electrically interconnect conductive elements of the package 2200 with conductive elements of the assembly 600 and conductive elements of the external component 690.

In another embodiment, referring to FIG. 9, a package assembly 600' may have a similar construction as the assembly 600 shown in FIG. 8, except that end surfaces 34 of the bond elements 24 are flush with the surface 42, the chip 602 is joined by wire leads 622 to traces 618 on the substrate and the assembly 600' further includes a redistribution layer 654. For example, the surface 607 of the chip 602 may be attached by an adhesive layer 611 with a portion of the layer 14 that the portion 212 overlies, and the wire leads 622 may extend from the contacts 604, over the surface 607 and an edge surface 613 of the chip 602, to the traces 618. Further, the layer 654 may be formed of dielectric material and extend along a portion of the surface 42 of at least one of the encapsulation elements 40, or a portion of the surface 628 of the mass 626. In one embodiment, the redistribution layer 654 may overlie only the portion 50 of the structure 10. In an alternative embodiment, the portion 212 may overlie a portion of the redistribution layer 654. Traces 658 may be electrically connected to inner contact pads 661 which are electrically connected to the end surfaces 34 of bond elements 24 and extend through substrate 656 of the redistribution layer 654 to contact pads 660 at surface 662 of the substrate 656. Another microelectronic assembly may then be connected to the contact pads 660 by solder masses or the like. The redistribution layer 654, in effect, serves as what is known as a fan-out layer that may allow the assembly 600' to connect to an array of a different configuration than the conductive element 26 array within the portion 50 would otherwise permit.

In a further embodiment, the assembly 600' may be joined with a microelectronic package, such as the package 2200 as described above (see FIG. 8), that overlies the redistribution layer 654. The surface 2208 of the package 2202 may face the surface 662 of the layer 654, and the conductive elements 2212 of the package 220 at the surface 2208 may be arranged in a pattern corresponding to the pattern of the contact pads 660 at the surface 662 of the layer 654. Solder elements 2215 may electrically connect such elements 2212 with the contact pads 660. As such, the conductive elements of the package 2200 may be electrically connected, through conductive elements of the redistribution layer and the bond elements 24, with conductive elements of the assembly 600' and conductive elements of the external component 690.

It is to be understood that, in accordance with the disclosure, a microelectronic element or a microelectronic package may be mounted "face-up" or "face-down" and coupled to a surface, such as a surface (e.g., 14, 16) of a substrate of a structure according to the disclosure or a surface (e.g., 692) of an external component joined with a package assembly including such structure, by wire bond, ball bond or other known connection technique.

Figure 10A:
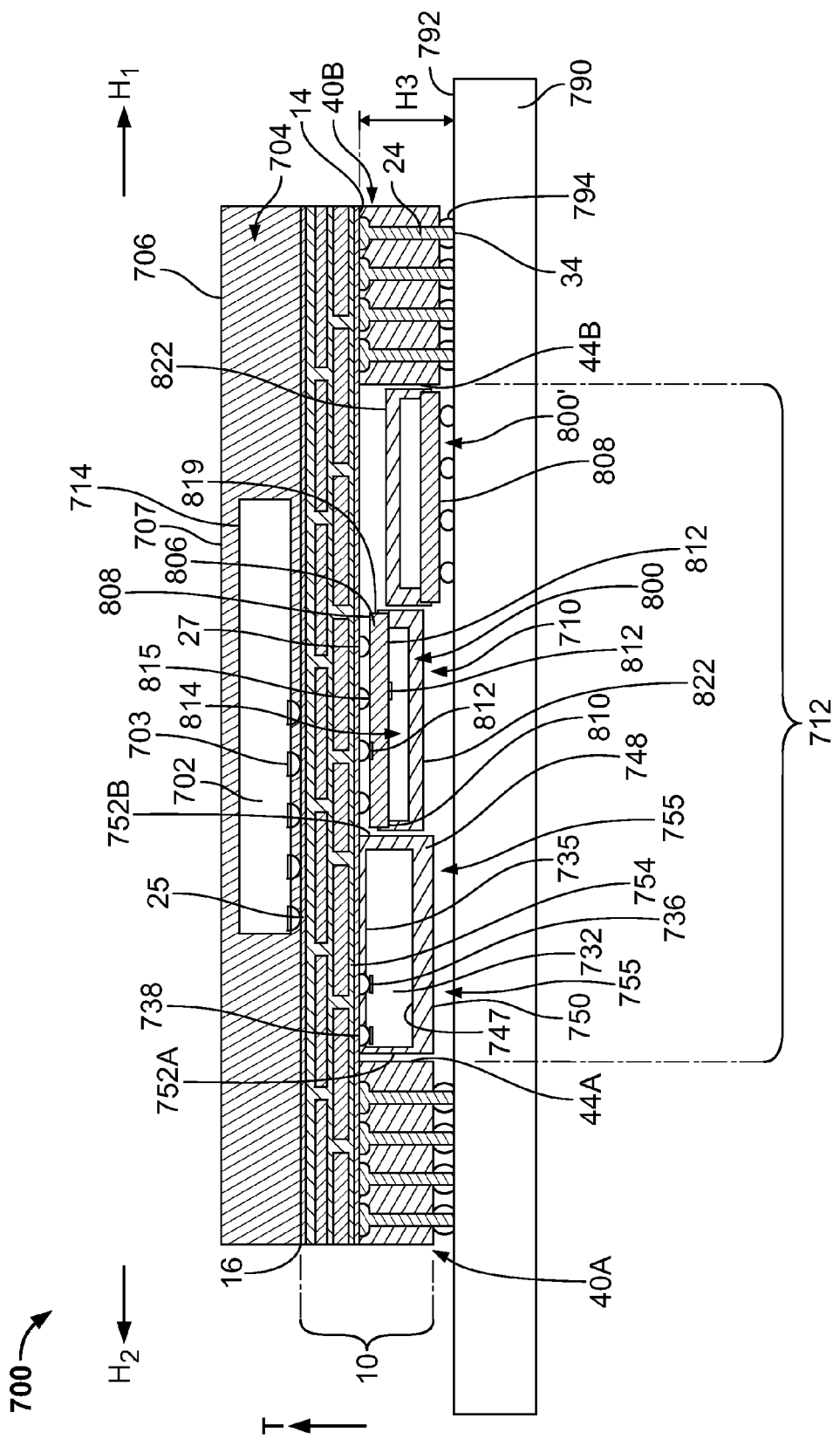
FIG. 10A is a diagrammatic sectional view of another exemplary package assembly including the structure of FIG. 3, in accordance with the disclosure.

In another embodiment, referring to FIG. 10A, a package assembly 700 may include a structure, according to the disclosure, joined with a plurality of microelectronic elements, where some of the microelectronic elements may be part of microelectronic packages. Referring to FIG. 10A, the assembly 700 may include the structure 10 as described above, and a microelectronic element 702 with its contacts 703 facing the surface 16 and electrically connected to pads 25 of the conductive elements 20 at the surface 16. A dielectric mass 704 is formed over the microelectronic element 702 and the surface 16, and has a surface 706 overlying the element 702 and the surface 16. The mass 704 covers the microelectronic element 702 and the surface 16, similarly as described above for the dielectric mass 626 formed over the element 602 and the surface 14 as in FIG. 8.

In addition, the package assembly 700 may include a microelectronic element 732 connected with conductive elements at the surface 14. The microelectronic element 732, similar to the microelectronic element 602, may be positioned in a "face-down" orientation relative to the surface 14 of the substrate 12 in the region 710, with the surface 735 facing the surface 14 of the substrate 12. Contacts 736 at the surface 735 may be bonded by solder elements to conductive elements 738 at the surface 14. The bottom portion 712 of the region 710 overlies the conductive elements 738. The contacts 736 may be electrically connected with other conductive components or elements electrically connected with the contacts 736 through electrical interconnections within the substrate 12, and also the bond elements 24 encapsulated within the elements 40A and 40B.

In addition, a mass of dielectric material 748 may be formed over the portion 712 of the region 710, similarly as discussed above for the overmold 628. The dielectric mass 748 has a surface 750 remote from the surface 14 that extends over the microelectronic element 732 and away from the element 732 over the surface 14 in the horizontal directions $H_1$ and $H_2$ toward the edge surfaces 44A and 44B of the encapsulation elements 40A and 40B, respectively. In one embodiment, the surface 750 may be spaced from the edge surfaces 44A and 44B, and the mass 748 includes edge surfaces 752A and 752B extending downwardly therefrom to the substrate 12 facing and spaced from the edge surfaces 44A and 44B, respectively. In another embodiment, one of the edge surfaces 752, such as the edge surface 752A, may at least partially contact a portion of the edge surface 44A. The dielectric mass 748 may be made from a first dielectric material, and the encapsulation elements 40 may be made from a second dielectric material that is different from the first dielectric material. The dielectric mass 748 further includes a bottom surface 754 extending along exposed portions of the surface 14 and traces 738 at the surface 14 in horizontal directions $H_1$ and $H_2$ and spaced from the elements 40A and 40B.

Figure 11:
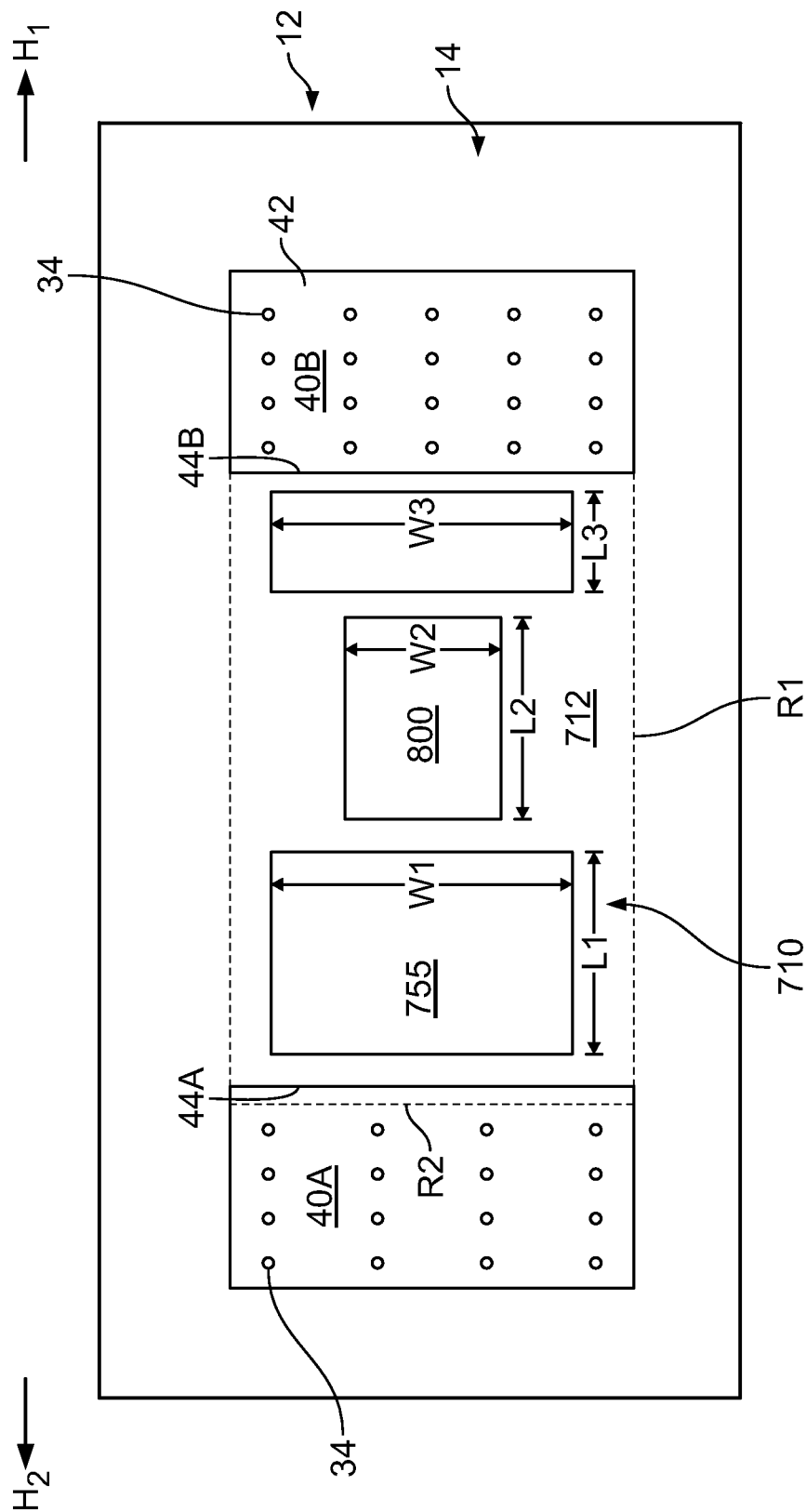
FIG. 11 is a bottom plan view of the package assembly of FIG. 10A.

Referring to FIG. 11, which is a plan view of the embodiment of the assembly 700 viewed in the direction of the surface 14, the mass 748, having the microelectronic element 732 encapsulated therein to form encapsulated microelectronic unit 755, extends a predetermined length L1 less than R1 in the horizontal direction H1 and a predetermined length W1 less than R2 in the direction orthogonal to the horizontal directions $H_1$ and $H_2$ and parallel to the surface 14. In addition, referring to FIG. 10A, the mass 748 has a thickness in the direction T of not more than a predetermined thickness H2, which is a distance in the thickness direction T from the surface 14 to a facing surface 792 of an external component 790 to which the bond elements 24 are electrically interconnected at the end surfaces 34 by solder elements 794, less an expected thickness of the solder element 794. For example, the mass 748, at the surface 754, may extend over a horizontal area having maximum dimensions of W1 and L1, have a predetermined shape in the thickness direction T and have a thickness extending from the surface 14 to the surface 750 at most equal to H3, such that the end surfaces 34 at the surfaces 42 of the elements 40 may be aligned in the thickness direction of the assembly 700 with pads (not shown) on the surface 792 of the external component 790 and the mass 750 is within the region 710 without contacting the elements 40, the component 790 or other components within the region 710.

In some embodiments, the assembly 700 including the microelectronic unit 755 as shown in FIG. 10A may also be connected to a microelectronic package 800 arranged within the region 710 and connected to terminals 27 of conductive elements 18 that the portion 712 overlies. The package 800 may include a substrate 806 having a first surface 808 remote from a second surface 810, where the first surface 808 faces the surface 14, and conductive elements 812 extending along the surfaces 808 and 810. In addition, a microelectronic element 814 is positioned in a "face-down" orientation facing the surface 810, and contacts (not shown) of the microelectronic element 814 are bonded to the conductive elements 812 on the surface 810 by solder elements (not shown). Further, the conductive elements 812 on the surface 808 are electrically connected by solder elements 815 to the terminals 27 at the surface 14. A dielectric mass 820 is formed over the microelectronic element 814 and a portion of the surface 810 of the substrate 806 and opposing edges 819 extending between the surfaces 808 and 810 to encapsulate the element 802 and a portion of the substrate 806, such as using any of the techniques described to form a dielectric mass. A surface 822 of the mass 820, remote from the substrate 806, overlies the microelectronic element 814 and portions of the surface 810 adjacent the element 814.

Further referring to FIG. 11, the package 800 has a predetermined size and configuration and is arranged at a predetermined position over the surface 14 spaced in the direction H1 from the microelectronic unit 755, and spaced in the direction H2 from the element 40B, so not to contact the elements 40 and the unit 755. Similar to the unit 755, the package 800 may be positioned over the surface 14 with pads (not shown) at the surface 808 aligned in the thickness direction T with corresponding ones of terminals 27 at the surface 14 and so that the portion 712 overlies the package 800. The package 800 extends a predetermined length L2 less than R1 in the horizontal direction $H_1$ and a predetermined length W2 less than R2 in the direction orthogonal to the horizontal directions $H_1$ and $H_2$ and parallel to the surface 14.

Further, in some embodiments, a microelectronic package 800' may be arranged within the region 710 and spaced from the other components within the region 710. For example, referring to FIGS. 10 and 11, the package 800', which may have the same or similar construction and components as the package 800, may be arranged between and spaced from the element 40B and the package 800, and extend a predetermined length L3 less than R1 in the horizontal direction $H_1$ and a predetermined length W3 less than R2 in the direction orthogonal to the horizontal directions $H_1$ and $H_2$ and parallel to the surface 14. The package 800' may have the surface 808 facing the surface 792 of the external component 790 and terminals 812 on the surface 808 connected with corresponding ones of pads (not shown) on the surface 792. Similar to the package 800, the package 800' has a thickness in the direction of the thickness of the assembly 700 not greater than H2.

As such, any microelectronic element in the region 710, such as part of an encapsulated microelectronic unit, a microelectronic package connected to the conductive elements at the surface 14 that portion 712 overlies, or a microelectronic package connected to pads of an external component, have a height in the thickness direction T of the assembly 700 that permits the array of the end surfaces of the bond elements 24 to connect with corresponding ones of conductive elements of the external component 790. In one embodiment, the microelectronic element 702 may be logic and the microelectronic elements arranged within the region 712 may be memory.

In some embodiments, the microelectronic elements and packages within the region 710 may extend over a horizontal area having dimension less than R1 and R2, have a predetermined shape in the thickness direction T and have a thickness extending from the surface 14 to the surface 792 at most equal to H2, such that the end surfaces of the bond elements 24, and terminals of the package 800', may be aligned in the thickness direction of the assembly 700 with pads (not shown) on the surface 792 of the external component 790, and the packages 800 and 800' and the microelectronic element 752 are within the region 712 without contacting one another and the encapsulation elements 40. Solder elements 794 may electrically interconnect the bond elements 24 with corresponding contacts of the component 790, and electrically interconnect conductive elements of the package 800' with corresponding contacts of the component 790.

In another embodiment, the package 800' has a thickness in the direction T such that the surface 822 is adjacent the surface 14 and, in some embodiments, at least partially contacts the surface 14 or is attached with an adhesive to the surface 14.

Figure 10B:
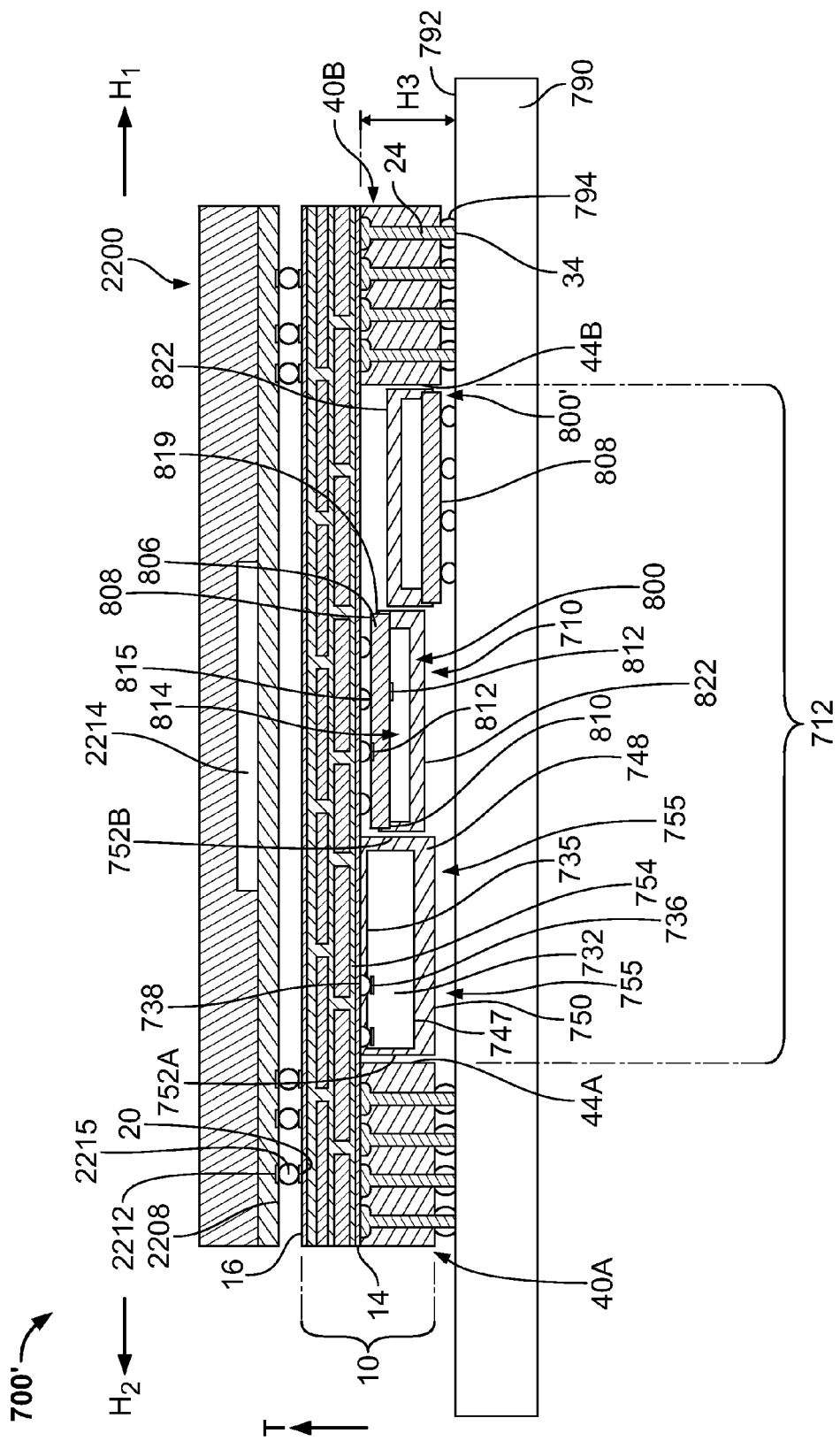
FIG. 10B is a diagrammatic sectional view of another exemplary package assembly including the structure of FIG. 3, in accordance with the disclosure.

In a further embodiment, referring to FIG. 10B, a package assembly 700' may have a similar construction as the package assembly 700 (see FIG. 10A) except that a microelectronic package, such as the package 2200 as described above (see FIG. 8), overlies the surface 16 of the structure 10 instead of the microelectronic element 702 and the dielectric mass 704. The surface 2208 of the package 2202 may face the surface 16 of the substrate 12, and the conductive elements 2212 of the package 2200 at the surface 2208 may be arranged in a pattern corresponding to a pattern of conductive elements 20 at the surface 16. Solder elements 2215 may electrically connect such elements 2212 with the conductive elements 20. As such, the conductive elements of the package 2200 may be electrically connected, through conductive elements within or at a surface of the substrate 12, with conductive elements of the packages 800 and 800', the unit 755 and the external component 790.

Figure 12:
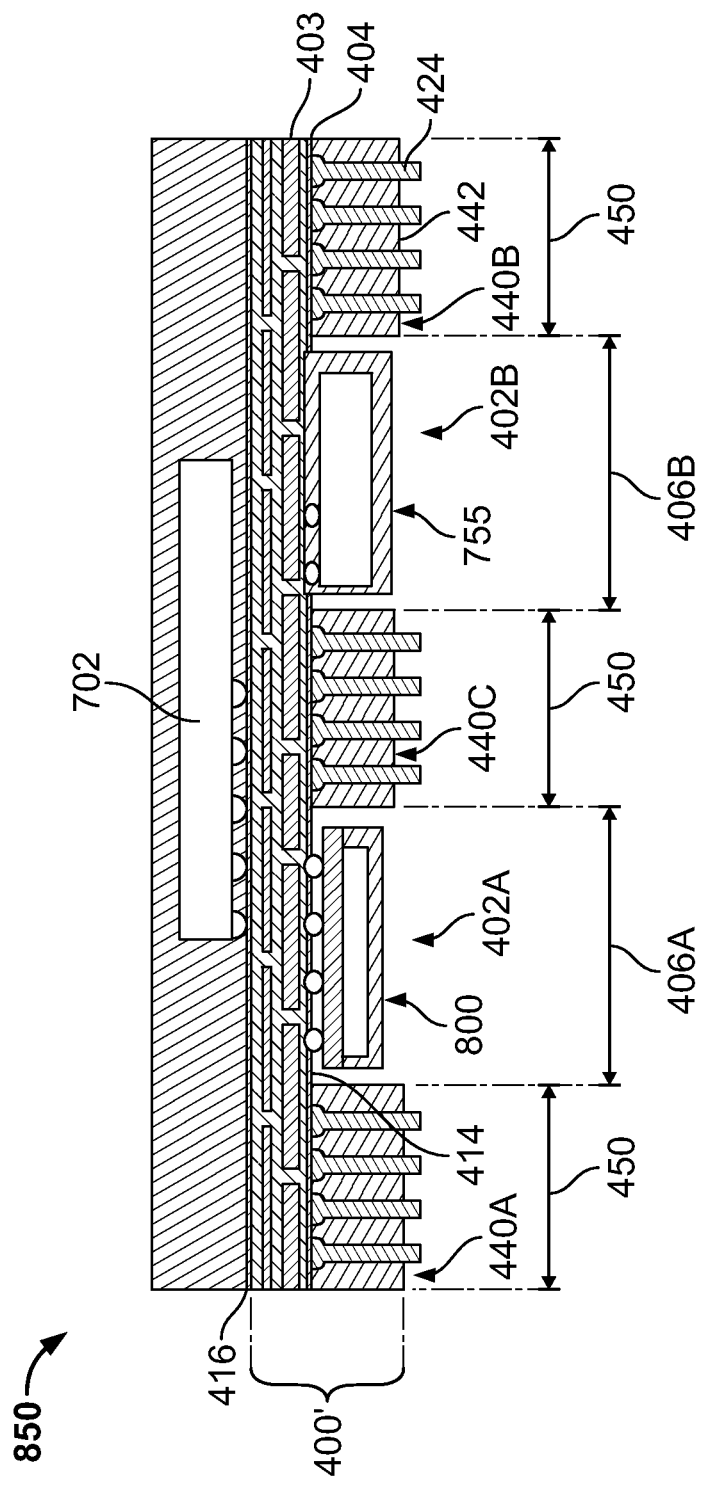
FIG. 12 is a diagrammatic sectional view of an exemplary package assembly including the structure of FIG. 5, in accordance with the disclosure.

In another embodiment, referring to FIG. 12, a package assembly 850 may include a structure 400' similar to the structure 400 (see FIG. 5) having encapsulation sub-elements 440A, 440B and 440C overlying a portion 450 of surface 414 of substrate 412. The elements 440A, 440B and 440C define a plurality of microelectronic receiving regions 402A and 402B having top portions 406A and 406B, respectively. A microelectronic element 702 is encapsulated by dielectric mass 704 over surface 416 of the substrate 412, where the surface 416 is opposite the surface 414 defining the microelectronic element receiving region, similarly as in the assembly 700. A microelectronic package 800 is arranged in the region 402A, connected to conductive elements at the surface 404 that the portion 406A overlies similarly as described for the assembly 700 of FIG. 10A, and so as not to contact the elements 440A and 440C. In addition, an encapsulated microelectronic unit 755 is arranged in the region 402B, connected to conductive elements at the surface 404 that the portion 406B overlies similarly as described for the assembly 700 of FIG. 10A, and so as not to contact the elements 440A and 440C. The package 800 and the unit 755 have a predetermined shape having height in the thickness direction of the assembly 800 to provide, similarly as described above with respect to FIG. 10A, that the end surfaces of the bond elements 424 may be electrically connected with corresponding ones of pads on a surface of an external component facing the surface 442 of the elements 440.

Figure 17:
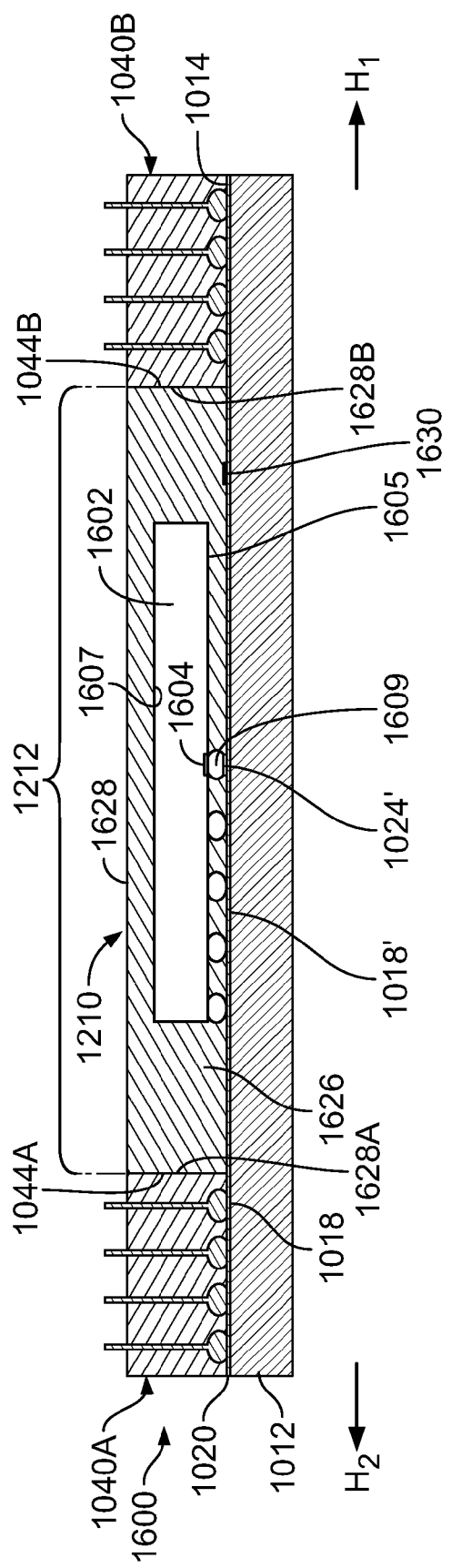
FIG. 17 is a diagrammatic sectional view of an exemplary package assembly including the structure of FIG. 15, in accordance with the disclosure.
Figure 18:
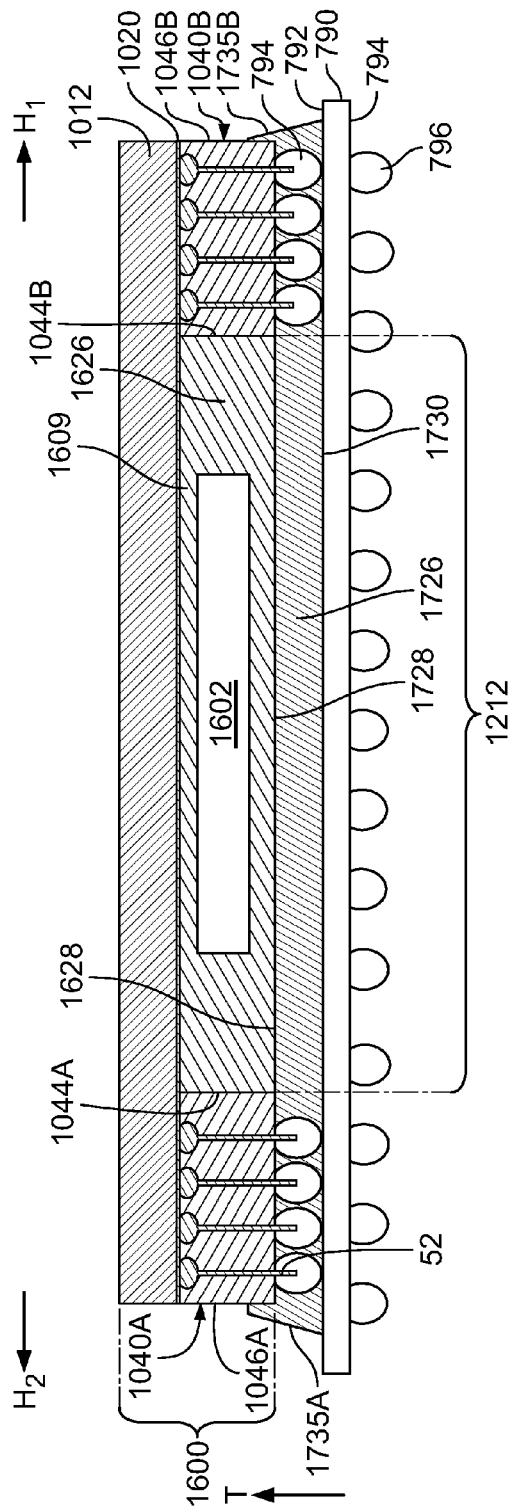
FIG. 18 is a diagrammatic sectional view of an exemplary package assembly including the structure of FIG. 15, in accordance with the disclosure.

In another embodiment, referring to FIGS. 17 and 18, a package assembly 1600 may include the structure 1010 of the present disclosure (see FIG. 15) connected to a microelectronic element, package or assembly at the microelectronic element region 1210 thereof. In one embodiment, the package assembly 1600 may include the structure 1010 connected to a microelectronic element 1602, such as a DRAM, having oppositely facing surfaces 1605, 1607 and positioned in a "face-down" orientation relative to the die 1012 in the region 1212, with the surface 1605 facing the surface 1014 of the die 1012. Contacts 1604 at the surface 1605 may be bonded by solder elements 1609 to traces 1024' at the surface 1017 of the redistribution layer 1020, or pads 1018' at the surface 1014 of the die 1012 where the layer 1020 is omitted from the structure 1010. The bottom portion 1212 of the region 1210 overlies the traces 1024' and pads 1018'. The contacts 1604 may be electrically connected with the bond' elements 24 within the elements 1040, through the traces 1024', the pads 1018' and 1018 of the die 1012 and electrical circuitry (not shown) within the die 1012.

A dielectric mass or overmold 1626, having a configuration similar to the mold 626 (see FIG. 8), may be formed over the bottom portion 1212 of the region 1210. The dielectric mass 1626 has a surface 1628 remote from the surface 1014 that extends over the microelectronic element 1602 and away from the element 1602 over the surface 1014 in the horizontal directions $H_1$ and $H_2$ toward the edge surfaces 1044A and 1044B of the encapsulation elements 1040A and 1040B, respectively. In one embodiment, the surface 1628 extends to the edge surfaces 1044A and 1044B, and edge surface 1628A and 1628B extend downwardly thereform to the layer 1020 or the die 12 facing, and in some embodiments along and contacting at least portions of, portions of the edge surfaces 1044A and 1044B, respectively. The dielectric mass 1626 may be made from a first dielectric material, and the encapsulation elements 1040 may be made from a second dielectric material that is different from the dielectric material of the mass 1626. The dielectric mass 1626 further includes a bottom surface 1630 extending from the edges surface 1628A and 1628B in horizontal directions $H_1$ and $H_2$ away from the encapsulation elements 1040A and 1040B and along exposed portions of the surface 1017 or 1014 and traces 1024' or pads 1018' thereon, respectively.

Referring to FIG. 18, the assembly 1600 may be positioned in a "face-down" or "flip assembly" orientation relative to an external component, such as the component 790 (see FIG. 10A), with the unenapsulated portions 52 of the bond elements 24 facing the surface 790 and electrically connected by solder elements 794 to contacts (not shown) on the surface 792 arranged in a pattern corresponding to the unenapsulated portions 52 of the structure 1010 within the assembly 1600. A dielectric mass 1726 may be formed over the microelectronic element 1602 and extend from a surface 1728, which extends along the surface 1628 and the surfaces 1042 of the encapsulation elements 1040, to an opposite surface 1730, which is remote from the mass 1626. The surface 1730 may extend along the surface 1728 in the directions $H_1$ and $H_2$ to be aligned in the direction $H_1$ and $H_2$ with, or extend beyond, the edges 1046A and 1046B, respectively. Opposite edge surfaces 1735A and 1735B of the mass 1726 may extend from the surface 792 to the surfaces 1046A and 1046B, respectively, in a vertical direction or angled with respect to the surfaces 792 and 1042. The dielectric material of the mass 1726 may fill any empty space between the component 790 and each of the mass 1626 and the encapsulation elements 1040, so as to encapsulate the unencapsulated portions 52 of the bond elements 24, the solder elements 794 and conductive elements on the surface 792 opposite the assembly 1600. As such, similar to the connection of the assembly 700 to the component 790 as shown in FIG. 10A, the assembly 1600 may be electrically connected to the conductive elements of the component 790 where the height of the assembly 1600 in the thickness direction T permits the array of the end surfaces of the bond elements 24 to connect with corresponding ones of conductive elements of the external component 790. In addition, the external component may include traces (not shown) on a surface 794 opposite and remote from the surface 792 and to which solder elements 796 may be joined to provide for electrical connection of the die 1012 and the microelectronic element 1602 to still another external component (not shown) through the bond elements 24 and conductive elements on and within the substrate 790.

Figure 19:
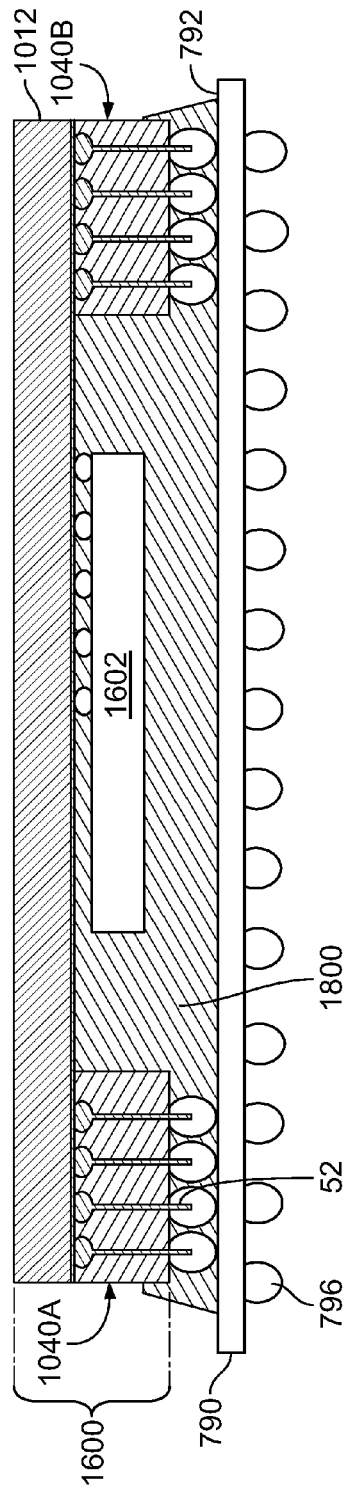
FIG. 19 is a diagrammatic sectional view of an exemplary package assembly including the structure of FIG. 15, in accordance with the disclosure.

In some embodiments, such as in the assembly 1600 (see FIG. 18), the mass 1626, the mass 1726 and the encapsulation element 1040 may be formed, respectively, from different dielectric materials. In a further embodiment as shown in FIG. 19, the assembly 1600 may be joined with an external component, similarly as illustrated in FIG. 18, except that a dielectric mass 1800 of a same dielectric material, having the configuration of the mass 1626 and the mass 1726 as described above, encapsulates the microelectronic element 1602, the unencapsulation portions 52 of the bond elements and conductive elements at the surface 792. The mass 1800, however, is made from a different dielectric material than the encapsulation elements 1040.

In another embodiment, referring to FIG. 20, a package assembly 1800 may include a structure 1900 having a single encapsulation element 1840 overlying the die 1012 in a configuration similar to the encapsulation element 450 overlying the substrate as shown in FIG. 7D, to define a plurality of microelectronic receiving regions 402. The element 1840 includes portions 1840A, 1840B and 1840C that define a plurality of microelectronic receiving regions 402A and 402B similarly as shown in FIG. 7D, having portions 406A and 406B, respectively, overlying portions 1017A and 1017B of the layer 1020, which in turn overlie portions 1014A and 1014B of the surface 1014 of the die 1012. A microelectronic package 800, similarly as in the assembly 700 of FIG. 10A, may be arranged in the region 402A and connected to conductive elements at the surface 1017A that the portion 406A overlies, and does not contact adjacent portions 1840A and 1840C of the encapsulation element 1840 that define the region 402A. In addition, a microelectronic package 800', also similarly as shown in FIG. 10A, may be arranged within the region 402B, spaced from the portions 1840C and 1840B and connected to the component 790 at the surface 792. The packages 800 and 800' may have a predetermined shape having height in the thickness direction of the structure 1900 to provide, similarly as described above with respect to FIG. 10A, that the end surfaces of the bond elements 24 may be electrically connected with corresponding ones of pads on a surface of an external component facing the unencapsulated portions 52 of the bond elements 24 at the surface 1842 of the elements 1840 remote from the die 1012.

In another embodiment, referring to FIG. 21, a package assembly 2000 may include the structure 1900 (see FIG. 20) connected to microelectronic elements 2102A and 2102B arranged within the regions 402A and 402B and overlying the portions 406A and 406B, respectively, thereof. Similar to the microelectronic element 1602 in FIG. 18, the pads of the microelectronic elements 2101A and 2101B are joined by solder elements 1609 with traces at the portions 1017A and 1017B, respectively. Dielectric masses 2026A and 2026B are formed overlying the microelectronic elements 2102A and 2102B and have configurations similar to the mass 1626 as shown in FIG. 18, where respective opposite edge surfaces 2028A and 2028B thereof face, and in some embodiments contact, at least portions of facing edge surfaces 1844 of the elements 1840. For example, portions of the opposite edges surfaces 2028A may contact portions of the facing edge surface 1844A and 1844C, respectively, and portions of the opposite edges surfaces 2028B may contact portions of the facing edge surfaces 1844C and 1844B, respectively. The dielectric masses 2026A and 2026B may be made from a same or different dielectric material, and the material of the masses 2026 is different from the dielectric material of the encapsulation elements 1840.

Figure 13:
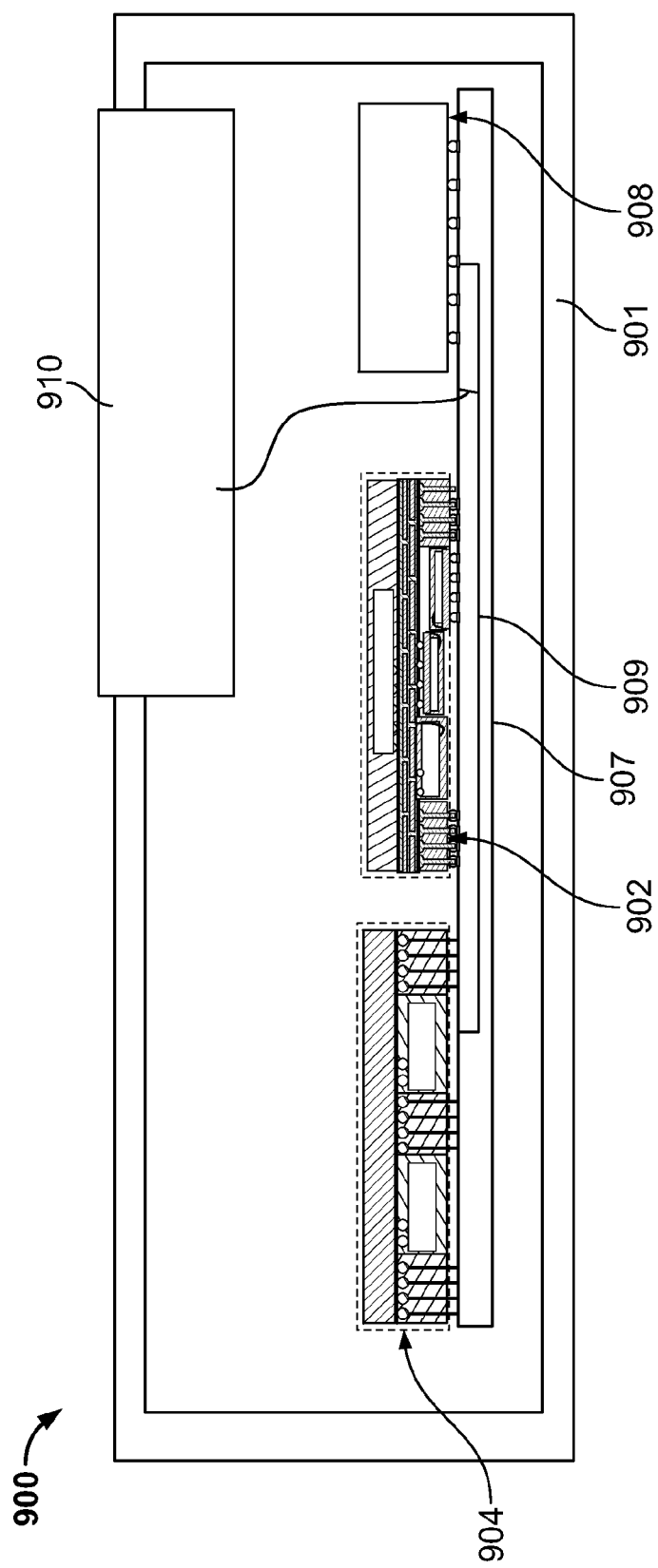
FIG. 13 is a diagrammatic view depicting a system according with the disclosure.

The assemblies discussed above may be utilized in construction of diverse electronic systems. For example, a system 900 (FIG. 13) in accordance with a further embodiment of the invention includes a first package assembly 902, such as the assembly 850, and a second package assembly 904, such as the assembly 2000, and in conjunction with other electronic components 908 and 910. In the example depicted, component 908 is a semiconductor chip whereas component 910 is a display screen, but any other components may be used. Of course, although only two additional components are depicted in FIG. 13 for clarity of illustration, the system may include any number of such components. Package assemblies 902 and 904 and components 908 and 910 are mounted to a common housing 901, schematically depicted in broken lines, and are electrically interconnected with one another as necessary to form the desired circuit. In the exemplary system shown, the system includes a circuit panel 907 such as a flexible or rigid printed circuit board, and the circuit panel includes numerous conductors 909, of which only one is depicted in FIG. 13, interconnecting the components with one another. An off-board connector connects component 910 to the circuit panel. However, this is merely exemplary; any suitable structure for making electrical connections may be used. The housing 901 is depicted as a portable housing of the type usable, for example, in a cellular telephone or personal digital assistant, and screen 910 is exposed at the surface of the housing. Again, the simplified system shown in FIG. 13 is merely exemplary; other systems, including systems commonly regarded as fixed structures, such as desktop computers, routers and the like may be made using the packages discussed above.

As these and other variations and combinations of the features discussed above may be utilized without departing from the present invention, the foregoing description of the preferred embodiments should be taken by way of illustration rather than by way of limitation of the invention as defined by the claims.

The invention claimed is:

1. A structure comprising:
a substrate having first and second oppositely facing surfaces and a plurality of electrically conductive elements at the first surface;
wire bonds having bases joined to respective ones of the conductive elements at a first portion of the first surface and end surfaces remote from the substrate and the bases, each of the wire bonds extending from the base to the end surface thereof; and
a dielectric encapsulation element overlying and extending from the first portion of the first surface of the substrate and separating the wire bonds from one another, the encapsulation element having a third surface facing away from the first surface of the substrate and having an edge surface extending from the third surface towards the first surface, wherein unencapsulated portions of the wire bonds are defined by at least portions of the end surfaces of the wire bonds that are uncovered by the encapsulation element at the third surface;
wherein the encapsulation element at least partially defines a second portion of the first surface, the second portion being other than the first portion of the first surface and having an area sized to accommodate a microelectronic element, and at least some of the conductive elements at the first surface are at the second portion and configured for connection with the microelectronic element.

2. The structure of claim 1, wherein a portion of at least one the wire bonds extending above the third surface is non-parallel to the third surface.

3. The structure of claim 1 further comprising:
solder at at least one of the base or the end surface of at least one of the wire bonds.

4. The structure of claim 3, wherein the solder at the end surface of the at least one wire bond is at the third surface.

5. The structure of claim 3, wherein the solder extends from the end surface of the at least one wire bond through a portion of the encapsulation element towards the third surface.

6. The structure of claim 1, wherein at least a portion of at least one of the wire bonds adjacent the end surface thereof is non-parallel to the third surface.

7. The structure of claim 1, wherein the substrate is a semiconductor substrate including electrical interconnections therein.

8. The structure of claim 1, wherein at least one of the wire bonds includes a stud bump joined to the end surface thereof.

9. The structure of claim 1, wherein at least one of the wire bonds extends along a substantially straight line between the base and the unencapsulated portion thereof, and wherein the substantially straight line forms an angle of less than 90° with respect to the first surface of the substrate.

10. The structure of claim 1, wherein at least one of the wire bonds includes a substantially curved portion between the base and the end surface thereof.

11. A method of making a structure comprising:
forming a dielectric encapsulation element on a substrate, the substrate having first and second oppositely facing surfaces and a plurality of electrically conductive elements at the first surface, and wherein wire bonds are joined at bases thereof to respective ones of the conductive elements at a first portion of the first surface and end surfaces of the wire bonds are remote from the substrate and the bases, each of the wire bonds extending from the base to the end surface thereof,
wherein the dielectric encapsulation element is formed overlying and extending from the first portion of the first surface of the substrate and separating the wire bonds from one another, the encapsulation element having a third surface facing away from the first surface of the substrate and having an edge surface extending from the third surface towards the first surface, wherein unencapsulated portions of the wire bonds are defined by at least portions of the end surfaces of the wire bonds that are uncovered by the encapsulation element at the third surface, and wherein the encapsulation element at least partially defines a second portion of the first surface, the second portion being other than the first portion of the first surface and having an area sized to accommodate a microelectronic element, and at least some of the conductive elements at the first surface are at the second portion and configured for connection with the microelectronic element.

12. The method of claim 11, wherein a portion of at least one the wire bonds extending above the third surface is non-parallel to the third surface.

13. The method of claim 11, wherein at least one of the wire bonds is joined at the base thereof to one of the conductive elements before the encapsulation element is formed on the substrate.

14. The method of claim 11, wherein at least one of the wire bonds is soldered at the base thereof to one of conductive elements before the encapsulation element is formed on the substrate.

15. The method of claim 14, wherein the solder extends from the end surface of the at least one wire bond through a portion of the encapsulation element towards the third surface.

16. The method of claim 11, wherein at least a portion of at least one of the wire bonds adjacent the end surface thereof is non-parallel to the third surface.

17. The method of claim 11, wherein the substrate is a semiconductor substrate including electrical interconnections therein.

18. The method of claim 11, wherein at least one of the wire bonds includes a stud bump joined to the end surface thereof.

19. The method of claim 11, wherein at least one of the wire bonds extends along a substantially straight line between the base and the unencapsulated portion thereof, and wherein the substantially straight line forms an angle of less than 90° with respect to the first surface of the substrate.

20. The method of claim 11, wherein at least one of the wire bonds includes a substantially curved portion between the base and the end surface thereof.

* * * * *